United States Patent [19]
Mori et al.

[11] Patent Number: 5,912,479
[45] Date of Patent: Jun. 15, 1999

[54] HETEROJUNCTION BIPOLAR SEMICONDUCTOR DEVICE

[75] Inventors: Hideki Mori, Kanagawa; Takayuki Gomi, Tokyo, both of Japan

[73] Assignee: Sony Corporation, Tokyo, Japan

[21] Appl. No.: 08/900,698

[22] Filed: Jul. 25, 1997

[30] Foreign Application Priority Data

Jul. 26, 1996 [JP] Japan .................................. 8-197148

[51] Int. Cl.⁶ ................ H01L 31/0328; H01L 31/0336; H01L 31/072; H01L 31/109
[52] U.S. Cl. ........................ 257/192; 257/194; 257/195; 257/197; 257/198
[58] Field of Search .................................. 257/197, 198, 257/195, 192, 194

[56] References Cited

U.S. PATENT DOCUMENTS

| | | | |
|---|---|---|---|
| 4,821,090 | 4/1989 | Yokoyama | 357/43 |
| 5,068,756 | 11/1991 | Morris et al. | 357/16 |
| 5,391,504 | 2/1995 | Hill et al. | 437/31 |
| 5,567,961 | 10/1996 | Usagawa | 257/197 |
| 5,583,059 | 12/1996 | Burghartz | 437/31 |

*Primary Examiner*—William Mintel
*Attorney, Agent, or Firm*—Hill & Simpson

[57] ABSTRACT

A semiconductor device includes a heterojunction bipolar transistor and a junction gate type field effect transistor which are formed on a semiconductor base. A base region and graft base regions of the heterojunction bipolar transistor, and a channel region and source/drain regions of the junction gate type field effect transistor, are formed of a first semiconductor layer of a first conduction type. The first semiconductor layer is formed of mixed crystals of silicon-germanium which has a higher carrier mobility than silicon. An emitter region of the heterojunction bipolar transistor and a gate region of the junction gate type field effect transistor are formed of a second semiconductor layer of a second conduction type which makes a heterojunction with the first semiconductor layer.

5 Claims, 19 Drawing Sheets

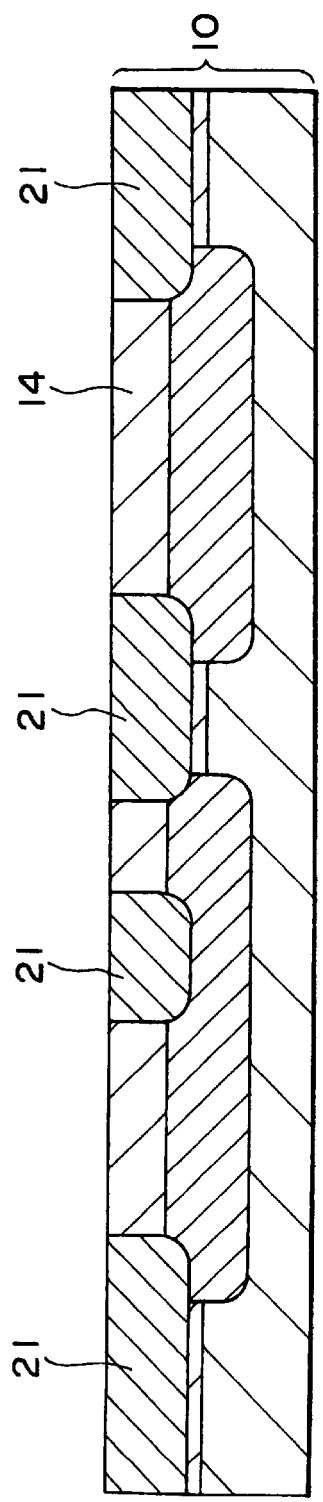
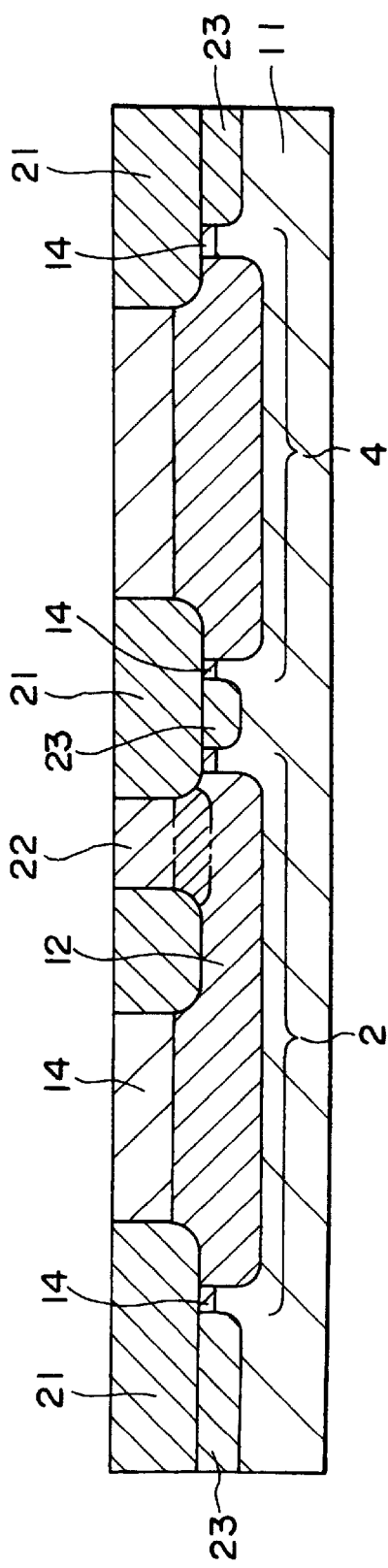

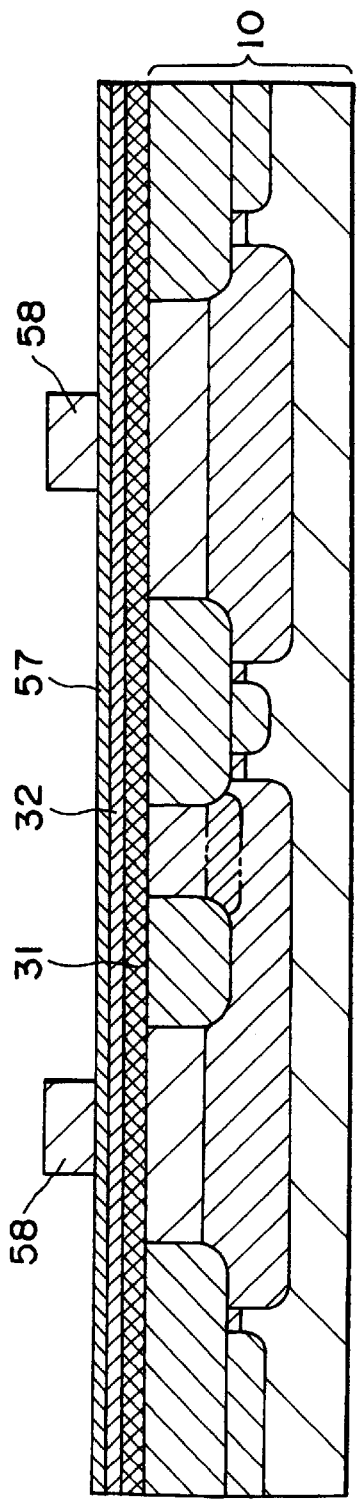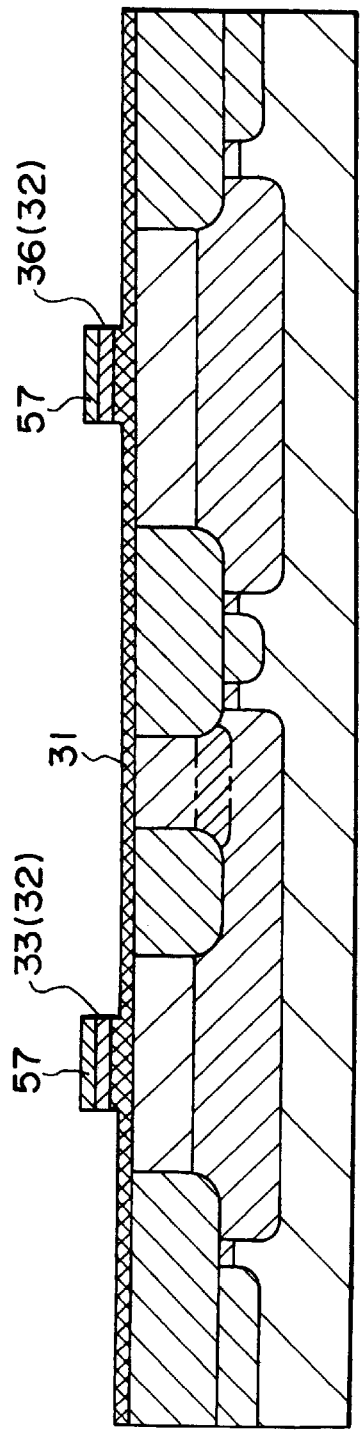

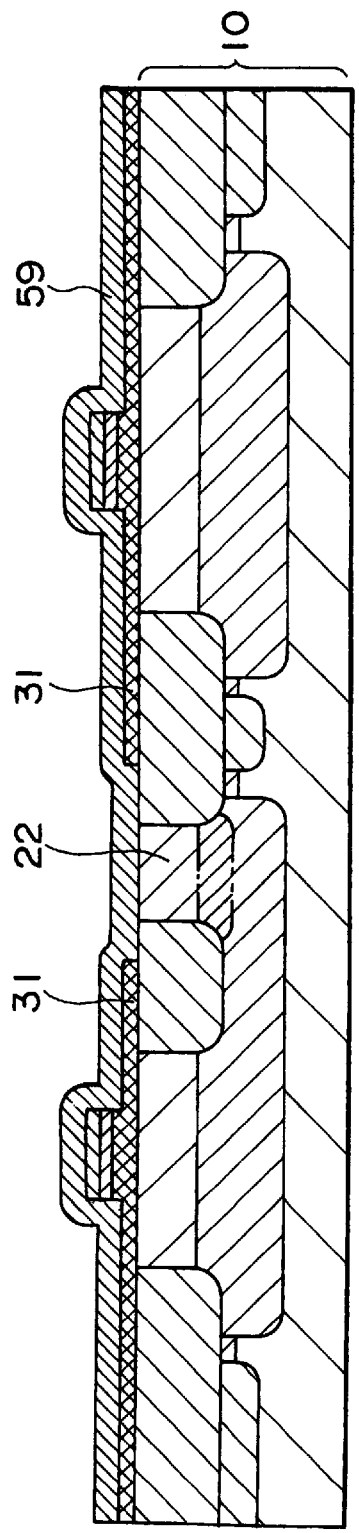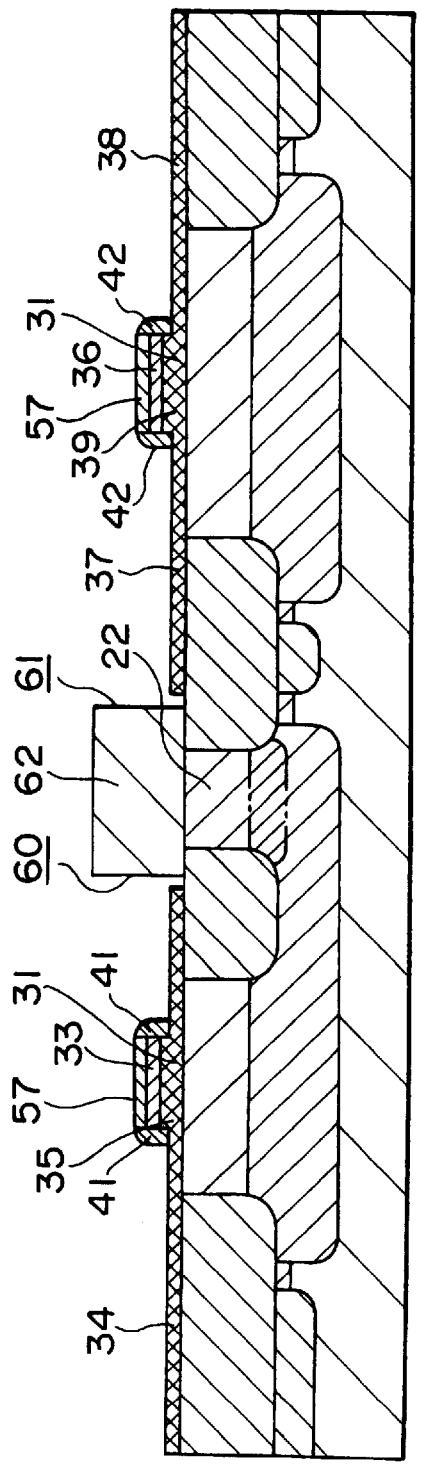

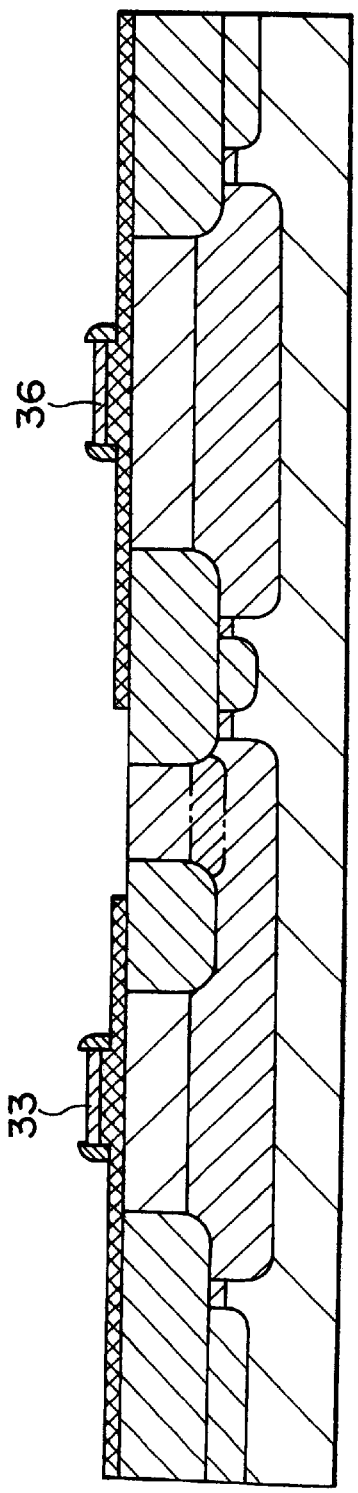
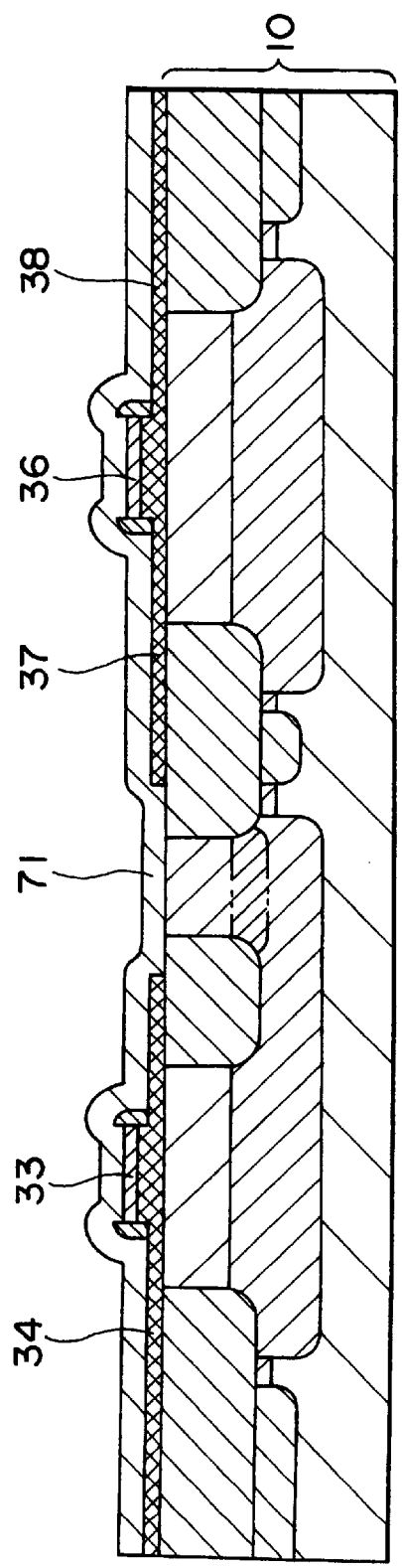

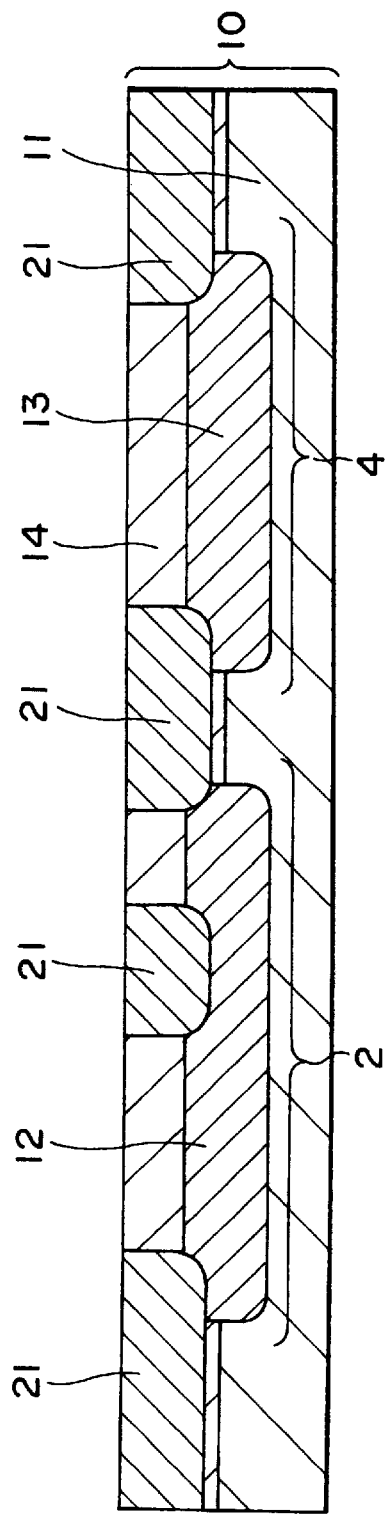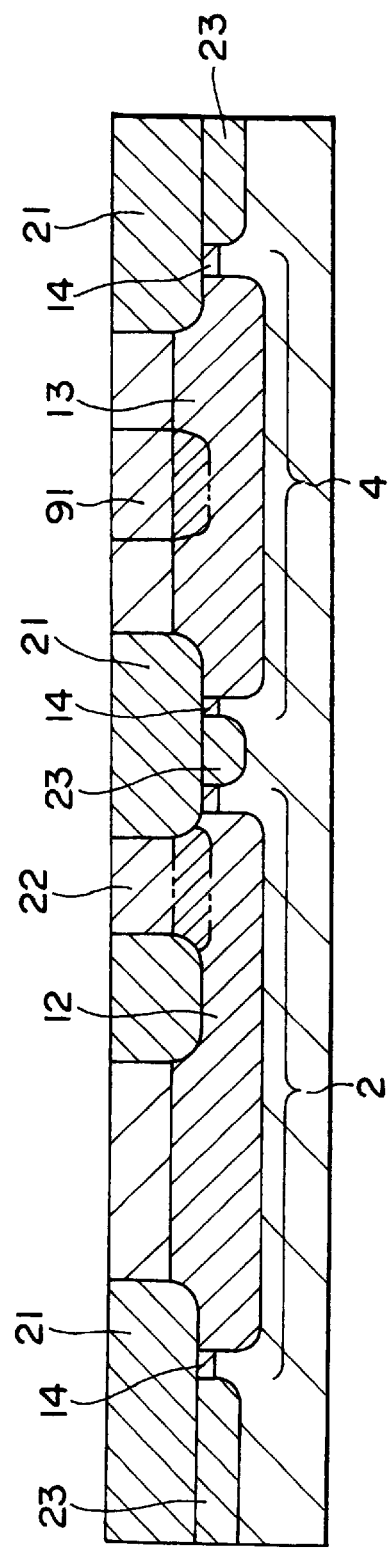

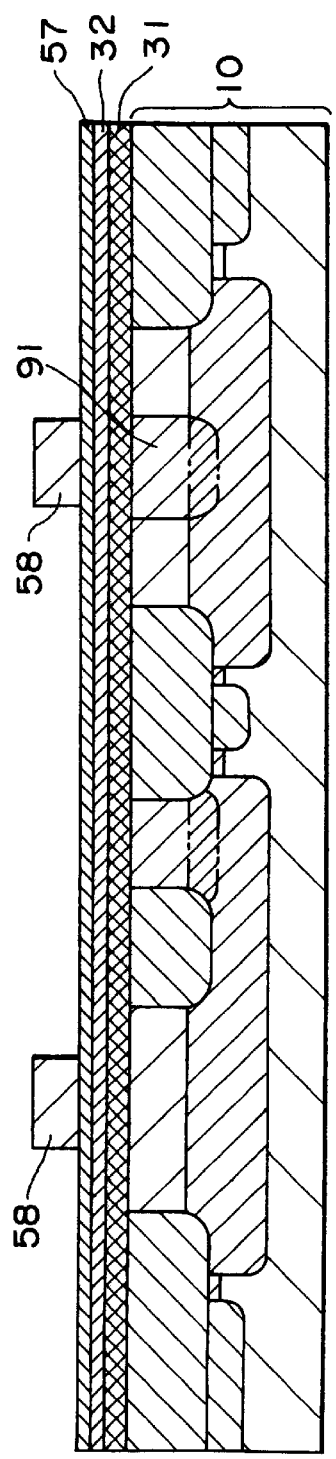
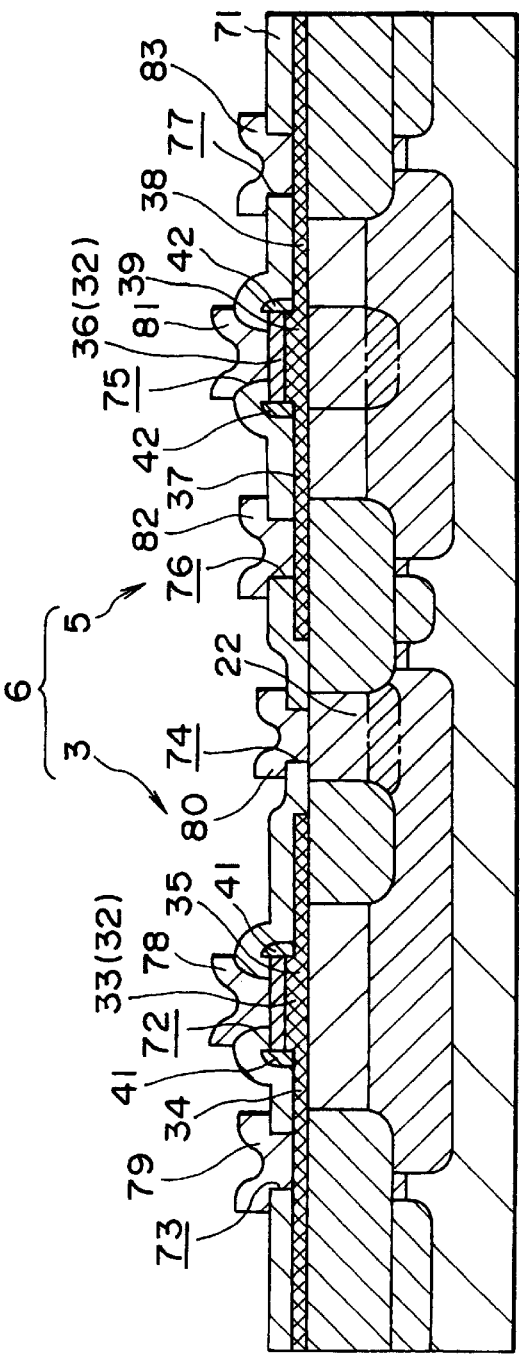
FIG. 4C
FIG. 4D

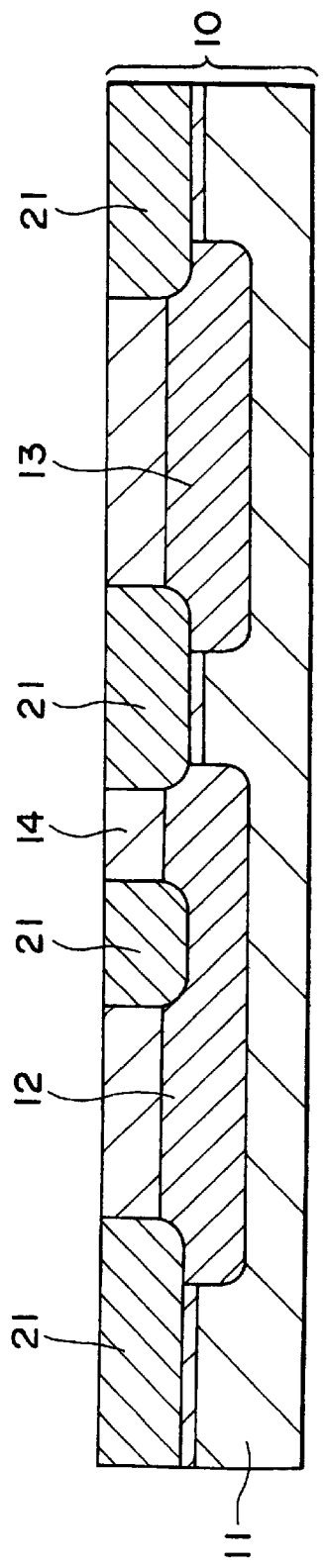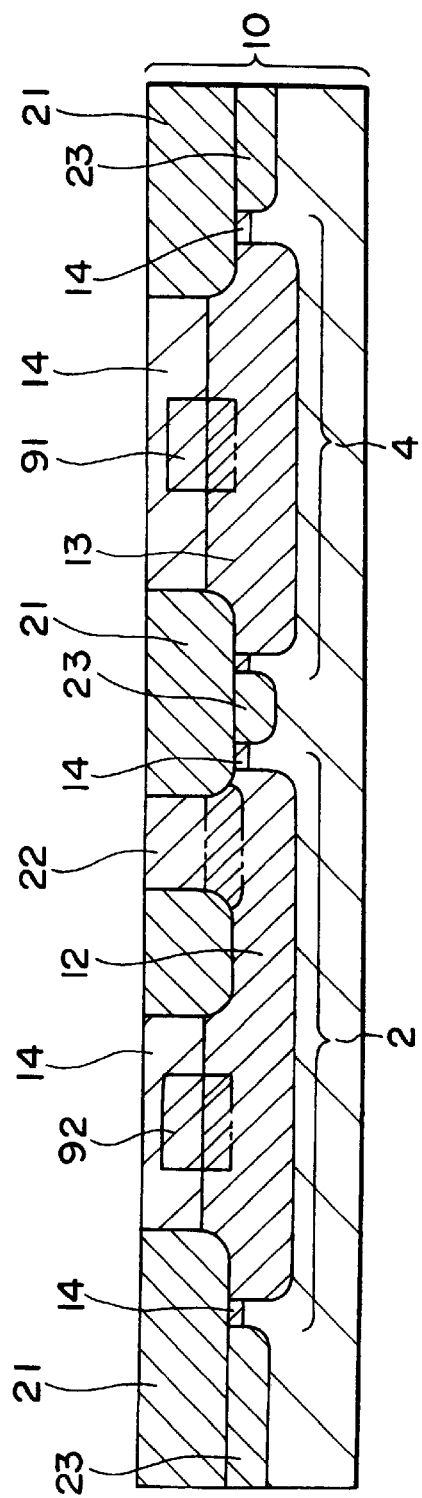

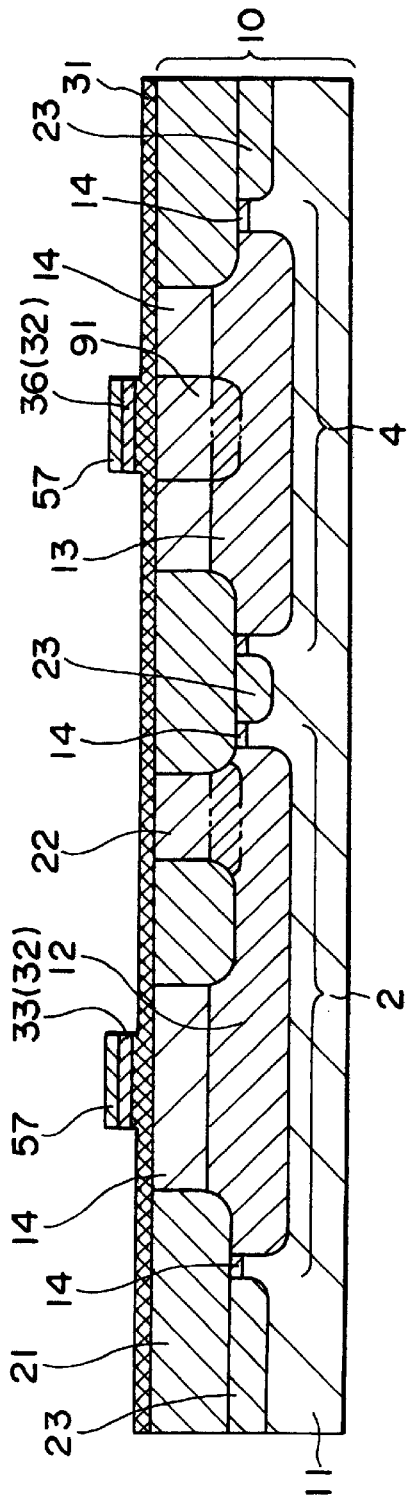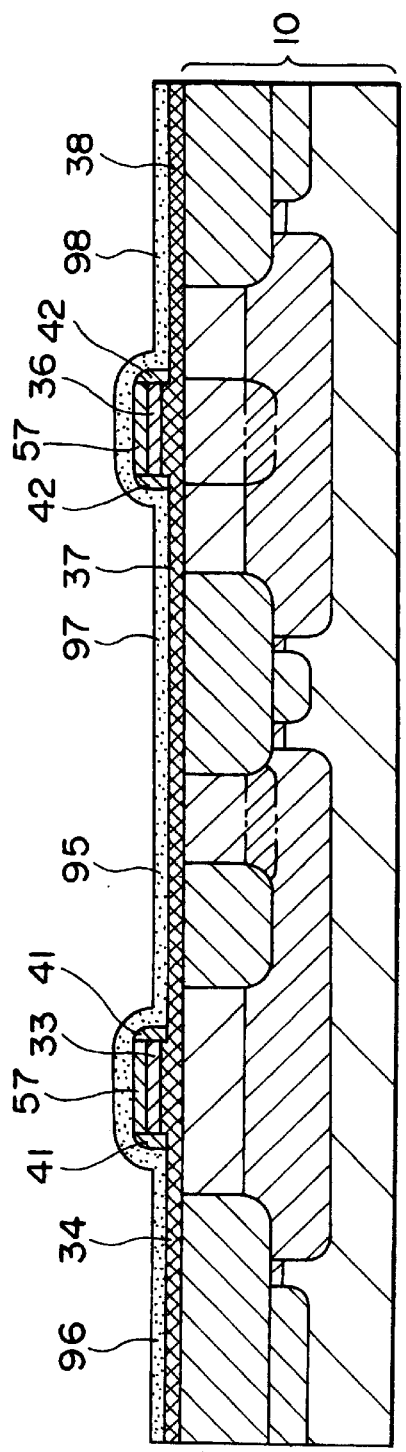

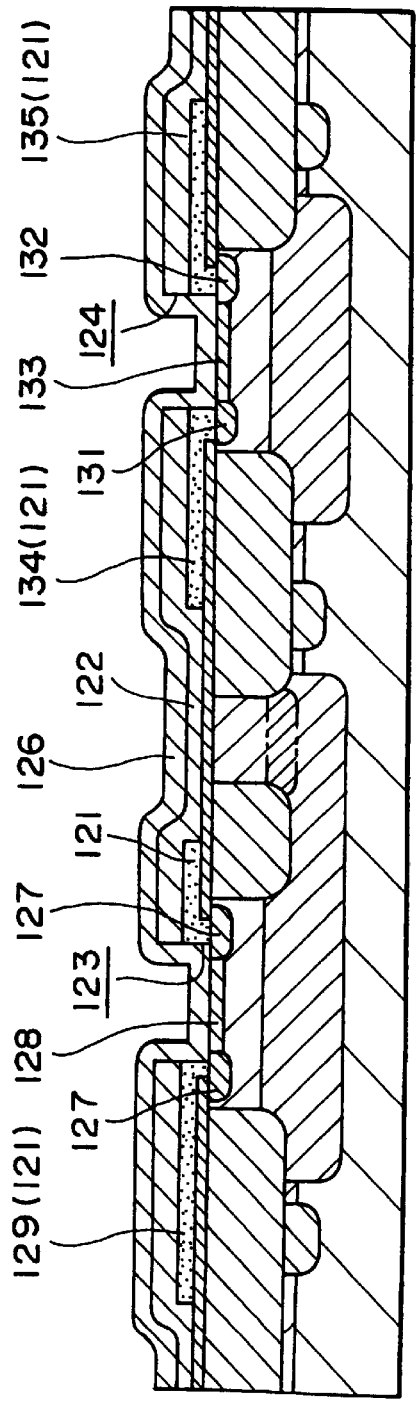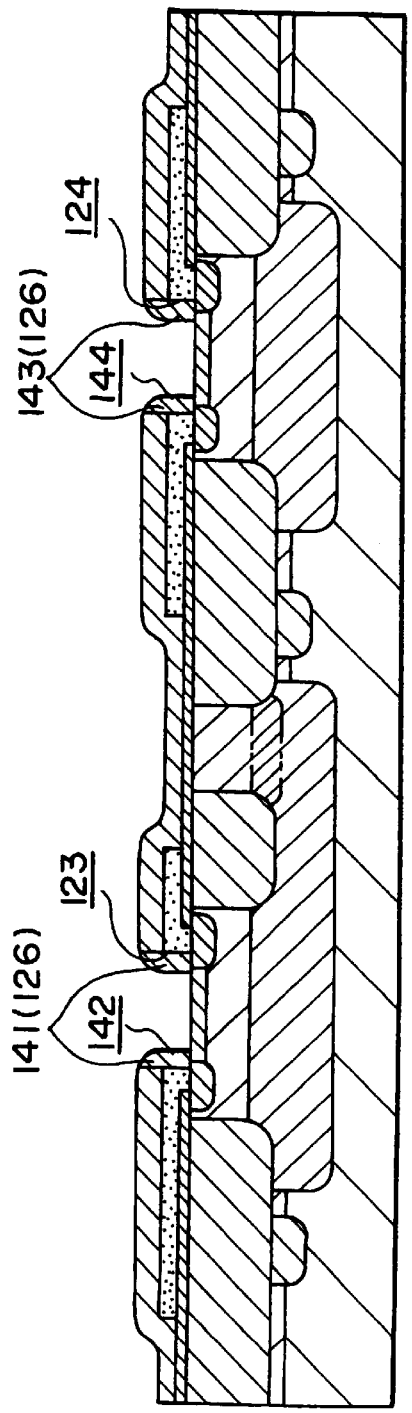

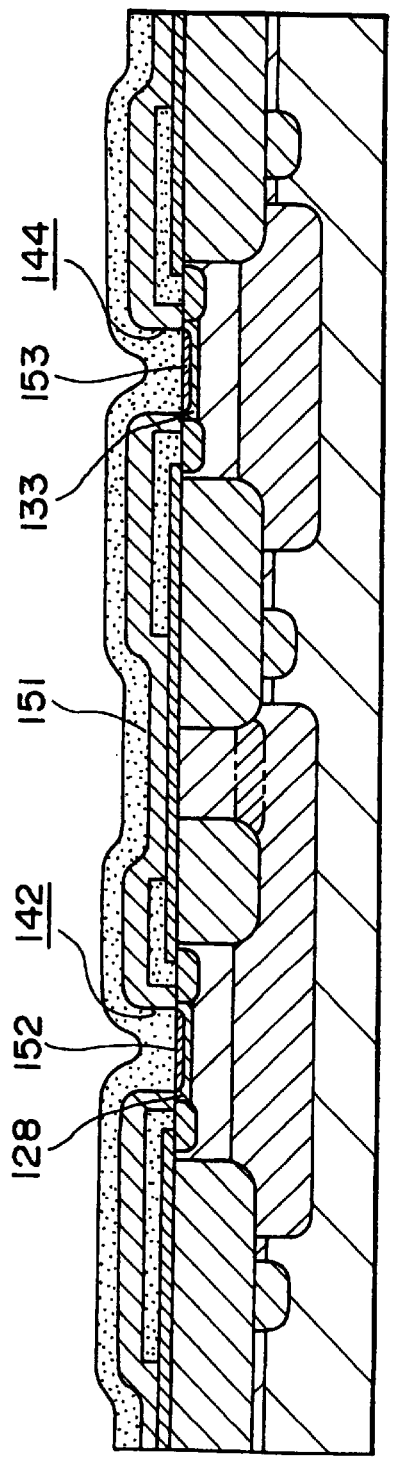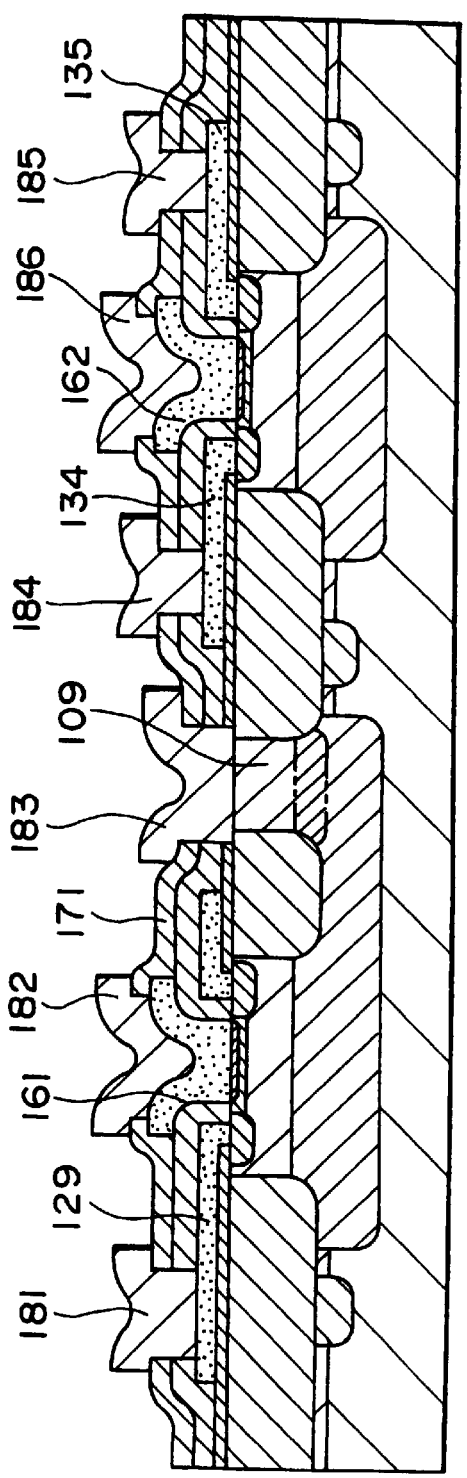

HETEROJUNCTION BIPOLAR SEMICONDUCTOR DEVICE

BACKGROUND OF THE INVENTION

1. Field of the Invention

The present invention relates to a semiconductor device including a junction gate type field effect transistor(J-FET) and a heterojunction bipolar transistor(HBT) on the same semiconductor base body, and a process of fabricating such a semiconductor device.

2. Description of the Related Art

In a so-called double polysilicon type bipolar transistor, graft base regions for a base region are formed by introduction of an impurity from a first polycrystalline silicon semiconductor layer forming a base electrode on a semiconductor substrate and an emitter region is formed by introduction of an impurity from a second polycrystalline silicon semiconductor layer forming an emitter electrode on the semiconductor substrate. This improves the self-alignment of the emitter position relative to that of the base and the self-alignment of the emitter electrode position relative to that of the base electrode. Such a double polysilicon type bipolar transistor enables high speed operation by reducing device area and has been used in high speed devices.

In the case of using the above described double polysilicon type bipolar transistor as a linear device, it is necessary to form a device such as a PNP transistor or junction gate type field effect transistor as well as an NPN transistor on the same semiconductor substrate.

A process of simultaneously forming a double polysilicon type bipolar transistor and a junction gate type field effect transistor on the same semiconductor substrate is now described with reference to FIGS. 7A to 7H. First, at a step shown in FIG. 7A, an $N^+$-type buried diffusion layer 102 is formed by selective diffusion or the like in an upper layer of a P-type silicon semiconductor substrate 101 at a region which will be taken as a double polysilicon type bipolar transistor forming region (hereinafter, referred to as a "first region"). At the same time, an $N^+$-type buried diffusion layer 103 is formed by selective diffusion or the like in an upper layer of the silicon semiconductor substrate 101 at a region which will be taken as a junction gate type field effect transistor forming region (hereinafter, referred to as a "second region"). An N-type epitaxial layer 104 is then formed on the silicon semiconductor substrate 101 by an epitaxial growth process. A semiconductor base body 105 is thus formed. In addition, the $N^+$-type buried diffusion layers 102, 103 are also diffused on the epitaxial layer 104 side.

Next, at the next step shown in FIG. 7B, a field oxide film 107 is formed by LOCOS (local oxidation of silicon) in such a manner as to be embedded in grooves (not shown) which are formed in the epitaxial layer 104 for isolating a base region, collector contact region, and field region from each other. Then, a P-type isolation diffusion layer 108 for isolating the first region from the second region is formed at a portion extending from the epitaxial layer 104 to the silicon semiconductor substrate 101 by selective ion implantation, and a collector contact region 109 connected to the $N^+$-type buried diffusion layer 102 is formed in the epitaxial layer 104 by selective ion implantation.

An insulating film 110 comprised of silicon oxide or the like is formed over the surface of the semiconductor base body 105, and is etched to have openings 112, 113 positioned over active regions of the first and second regions.

The process goes on to a step shown in FIG. 7C, in which a first polycrystalline silicon semiconductor layer is formed over the entire surface of the semiconductor base body 105 formed with the insulating film 110 to a thickness of, for example, about 150 nm by chemical vapor deposition (hereinafter, referred to as "CVD"), and the polycrystalline silicon semiconductor layer is doped with boron difluoride ($BF_2^+$) ions or boron ($B^+$) ions by ion implantation to form a P-type polycrystalline silicon layer 121.

At the next step shown in FIG. 7D, the polycrystalline silicon layer 121 is patterned by lithography and reactive ion etching (hereinafter, referred to as "RIE") to be left at a portion over which will be a base region, a portion which will be a base electrode, a portion over which will be a channel region, and portions which will be source/drain electrodes. Subsequently, an insulating film 122 comprised of silicon oxide or the like is formed by CVD in a state covering the polycrystalline silicon layer 121. Then, the polycrystalline silicon layer 121 left at the portion over which will be the base region and the insulating film 122 are patterned by lithography and RIE to have a base window 123 such that the surface of the semiconductor base body 105 is exposed therethrough. The polycrystalline silicon layer 121 left at the portion over which will be the channel region and the insulating film 122 are patterned by lithography and RIE to provide a channel window 124 in such a state that the surface of the semiconductor base body 105 is exposed therethrough.

A surface layer of the semiconductor base body 105 is doped with boron difluoride ($BF_2^+$) ions or boron ($B^+$) ions by ion implantation through the base window 123 and the channel window 124. The process goes on to a step shown in FIG. 7E, in which an insulating film 126 comprised of silicon oxide or the like is formed over the entire surface on the insulating film 122 by CVD followed by annealing to diffuse ions of the impurity contained in the polycrystalline silicon layer 121 to the upper layer of the semiconductor base body 105. This results in formation of graft base regions 127 and source/drain regions 131, 132.

The above described annealing activates ions of the impurity implanted through the base window 123, ions of the impurity implanted through the channel window 124, and ions of the impurity in the polycrystalline silicon layer 121. Thus, a base region (intrinsic base region) 128 connected to the graft base regions 127 and a base electrode 129 comprised of the polycrystalline silicon layer 121 are formed. At the same time, a channel region 133, and source/drain electrodes 134, 135 composed of the polycrystalline silicon layer 121 are formed.

At the next step shown in FIG. 7F, the insulating film 126 is etched-back to form side walls 141 on inner side walls of the base window 123 thus forming an emitter window 142, and to form side walls 143 on inner side walls of the channel window 124 thus also forming a gate window 144.

The process goes on to a step shown in FIG. 7G, in which a second polycrystalline silicon semiconductor layer 151 is formed by CVD to a thickness of, for example, about 150 nm in such a manner as to be embedded in the emitter window 142 and the gate window 144. Then, the polycrystalline silicon semiconductor layer 151 is entirely doped with phosphorus ($P^+$) ions or arsenic ($As^+$) ions by ion implantation, followed by annealing to form an emitter region 152 on a surface layer of the base region 128 and a gate region 153 on a surface layer of the channel region 133. The epitaxial layer 104 at a portion under the channel region 133 also forms a lower gate region.

At the next step shown in FIG. 7H, the polycrystalline silicon semiconductor layer 151 is patterned by lithography and RIE, to form an emitter electrode 161 connected to the emitter region 152 and a gate electrode 162 connected to the gate region 153. An insulating film 171 comprised of silicon oxide or the like is formed by CVD to cover the emitter electrode 161 and the gate electrode 162. Then, by lithography and RIE, the insulating film 171 is patterned to have electrode windows communicated to the emitter electrode 161 and gate electrode 162. The insulating films 171, 122 are patterned to have electrode windows communicated to the base electrode 129 and source/drain electrodes 134, 135, and the insulating films 171, 122, 110 are patterned to have an electrode window communicated to the collector contact region 109.

Finally, a metal electrode layer including a barrier metal such as aluminum (Al) or titanium (Ti)/titanium oxidenitride (TiON)/titanium/aluminum-silicon (Al—Si) is formed and is patterned by lithography and RIE, to form a metal electrode 181 connected to the base electrode 129, a metal electrode 182 connected to the emitter electrode 161, a metal electrode 183 connected to the collector contact region 109, a metal electrode 184 connected to the source/drain electrode 134, a metal electrode 185 connected to the source/drain electrode 135, and a metal electrode 186 connected to the gate electrode 162. The double polycrystalline silicon type bipolar transistor, and the junction gate type field effect transistor can be formed on the same semiconductor base body in this manner.

In the above-described related art process, however, since the channel region of the junction gate type field effect transistor is formed simultaneously with formation of the base region of the double polysilicon type bipolar transistor, if the impurity concentration of the polycrystalline silicon layer is set at a value which is sufficient for the base region, the channel resistance (source-drain resistance) becomes larger; and since the lower gate region is formed of the N-type epitaxial layer, it has a low impurity concentration. This limits the improvement in lower gate effect, specifically the mutual conductance gm. This makes it difficult to improve an amplitude ratio of the junction gate type field effect transistor.

In the semiconductor device 201 shown in FIG. 8, a high NPN bipolar transistor 202 having improved mutual conductance gm and a junction gate type field effect transistor 203 are formed on the same semiconductor substrate 200. A base region 211 of the high NPN bipolar transistor 202 has an impurity concentration profile of a so-called LEC (Lightly Emitter Concentration) structure in which the peak of the impurity concentration distribution is located at a portion deeper than an emitter/base junction where an emitter region 212 makes a junction with the base region 211. This is accomplished by ion implantation of an impurity at a high ion implantation energy, thus making the device able to withstand high voltage.

However, in the case where the base region 211 of the high NPN bipolar transistor is formed simultaneously with formation of the channel region 231 of the junction gate type field effect transistor 203, if the impurity concentration of the base region 211 is optimized, the impurity concentration of the channel region 231 becomes lower. This results in a shortcoming in that the mutual conductance gm can be improved, however, the channel resistance is increased.

SUMMARY OF THE INVENTION

The present invention relates to a semiconductor device capable of solving the above-described problems and a process of fabricating such a semiconductor device. Specifically, according to the present invention, the semiconductor device includes a heterojunction bipolar transistor (HBT) provided in a first region of a semiconductor base body and a junction gate type field effect transistor(J-FET) provided in a second region of said semiconductor base body. The second region is electrically separated from the first region. A base region of said heterojunction bipolar transistor; the graft base regions connected to said base region; a channel region of said junction gate type field effect transistor; and source/drain regions connected to said channel region, are all formed of a first semiconductor layer of a first conduction type. The first semiconductor layer is comprised of a semiconductor material which is higher in carrier mobility than silicon. An emitter region of said heterojunction bipolar transistor and a gate region of said junction gate type field effect transistor are formed of a second semiconductor layer of a second conduction type. The second semiconductor layer makes a heterojunction with said first semiconductor layer of said first conduction type.

In the above semiconductor device, preferably, a heavily doped diffusion layer is provided in a lower gate region formed in said semiconductor base body at a portion under said channel region of said junction gate type field effect transistor. The heavily doped diffusion layer is higher in impurity concentration than the lower gate region and is of the same conduction type as the lower gate region.

In the above semiconductor device, since the channel region of the junction gate type field effect transistor is formed of the first semiconductor layer of the first conduction type which is made of a semiconductor material higher in carrier mobility than silicon, when the base region of the heterojunction bipolar transistor is formed of the same first semiconductor layer, the channel resistance becomes lower and the mutual conductance gm becomes higher as compared with the related art device which uses a polycrystalline silicon layer. As a result, the junction gate type field effect transistor can exhibit a high amplitude ratio. Further, in the case where the heavily doped diffusion layer is formed in the lower gate region, the mutual conductance gm becomes higher, so that the junction gate type field effect transistor exhibits a higher amplitude ratio.

According to the present invention, a process of fabricating a semiconductor device is disclosed in which a heterojunction bipolar transistor is formed in a first region of a semiconductor base body and a junction gate type field effect transistor is formed in a second region of said semiconductor base body. The second region is electrically separated from said first region. The process includes a first step of forming a first semiconductor layer of a first conduction type on said semiconductor base body. The first semiconductor layer is made of a semiconductor material higher in carrier mobility than silicon. This is followed by formation of a second semiconductor layer of a second conduction type on the first semiconductor layer of said first conduction type in such a manner that the second semiconductor layer makes a heterojunction with the first semiconductor layer; a second step of patterning said second semiconductor layer of said second conduction type to form an emitter region of said heterojunction bipolar transistor and a gate region of said junction gate field effect transistor; a third step of forming emitter side walls on side walls of said emitter region and gate side walls on side walls of said gate region; and a fourth step of forming graft base regions of said heterojunction bipolar transistor in said first semiconductor layer of said first conduction type on both sides of said emitter region via said emitter side walls with a portion of said first semiconductor layer of said first conduction type between said graft base regions taken as a base region; and forming source/drain regions of said junction gate type field effect transistor in said first semiconductor layer of said first conduction type on both sides of said gate region via said gate side walls with a portion of said first semiconductor layer of said first conduction type between said source/drain regions taken as a channel region.

In the above fabrication process, the second semiconductor layer of the second conduction type is patterned to form the emitter region of the heterojunction bipolar transistor and the gate region of the junction gate type field effect transistor; emitter side walls are formed on side walls of the emitter region and gate side walls are formed on side walls of the gate region. Graft base regions of the heterojunction bipolar transistor are formed in the first semiconductor layer of the first conduction type on both sides of the emitter region via the emitter side walls with the first semiconductor layer of the first conduction type between the graft base regions taken as a base region. Source/drain regions of the junction gate type field effect transistor are formed in the first semiconductor layer of the first conduction type on both sides of the gate region via the gate side walls with the first semiconductor layer of the first conduction type between the source/drain regions taken as a channel region. Consequently, the heterojunction bipolar transistor and the junction gate type field effect transistor can be formed on the same semiconductor base body without the addition of any new step.

Further, since the channel region of the junction gate type field effect transistor is formed of the first semiconductor layer of the first conduction type which is made of a semiconductor which is material higher in carrier mobility than silicon, the channel resistance becomes lower and the mutual conductance gm becomes higher. The result is that the junction gate type field effect transistor can exhibit a high amplitude ratio.

DESCRIPTION OF THE DRAWINGS

FIGS. 3A to 3K are diagrams which illustrate steps of fabricating a semiconductor device according to a first embodiment of a fabrication process of the present invention;

FIGS. 4A to 4D are diagrams which illustrate steps of fabricating a semiconductor device according to a second embodiment of a fabrication process of the present invention;

FIGS. 5A to 5D are diagrams which illustrate steps of fabricating a semiconductor device according to a third embodiment of a fabrication process of the present invention;

FIGS. 6A to 6D are diagrams which illustrate steps of fabricating a semiconductor device according to a fourth embodiment of a fabrication process of the present invention;

FIGS. 7A to 7H are diagrams which illustrate steps of fabricating a semiconductor device according to a related art fabrication process.

DESCRIPTION OF THE PREFERRED EMBODIMENTS

Figure 1:
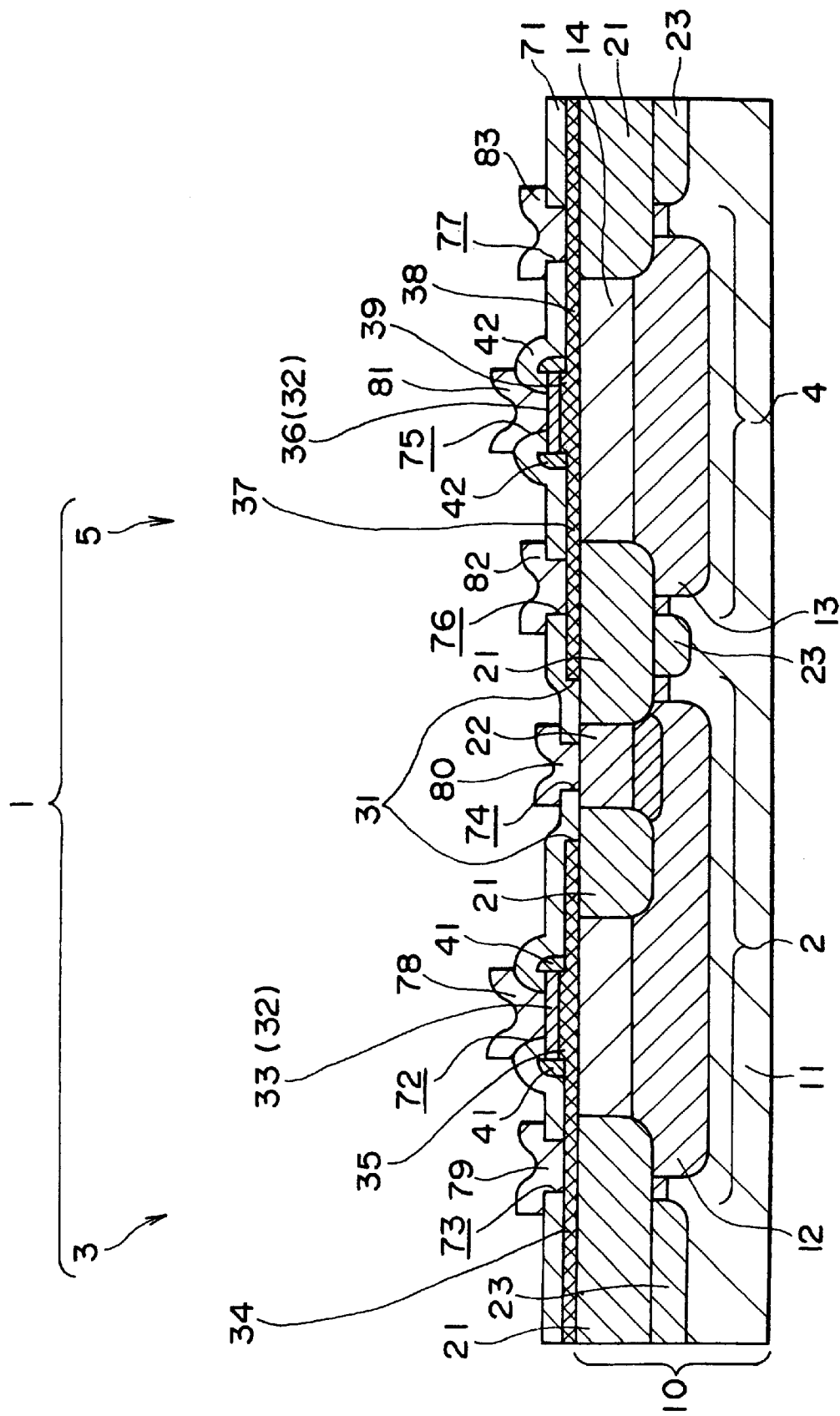
FIG. 1 is a sectional view which illustrates a schematic configuration of a first embodiment of a semiconductor device of the present invention.

A first embodiment of a semiconductor device of the present invention will be described with reference to a schematic sectional configuration of the first embodiment shown in FIG. 1. In FIG. 1, there is shown a semiconductor device in which a heterojunction NPN bipolar transistor and a junction gate type field effect transistor are formed on the same semiconductor base body. In the following description, it is assumed that a first conduction type is taken as a P-type and a second conduction type is taken as an N-type.

As shown in FIG. 1, a semiconductor device 1 includes a heterojunction bipolar transistor 3 provided in a first region 2 of a semiconductor base body 10 and a junction gate type field effect transistor 5 provided in a second region 4 of the semiconductor base body 10. The first region 2 is electrically separated from the second region 4.

The semiconductor base body 10 has the following configuration. $N^+$-type buried diffusion layers 12, 13 are formed in an upper layer of a silicon substrate 11, and an N-type epitaxial layer 14 is formed over the entire surface of the silicon substrate 11. The $N^+$-type buried diffusion layers 12, 13 are also diffused into a lower portion of the N-type epitaxial layer 14. A LOCOS oxide film 21 is formed in the N-type epitaxial layer 14 for isolating the first region 2 from the second region 4 and also isolating a collector contact region in the first region 2. The semiconductor base body 10 is thus prepared. It is to be noted that surface portions of the N-type epitaxial layer 14 and the LOCOS oxide film 21 are desired to be planarized as shown in FIG. 1.

An $N^+$-type collector contact region 22 connected to the $N^+$-type buried diffusion layer 12 is formed in the N-type epitaxial layer 14. A $P^+$-type isolation region 23 for isolating the first region 2 from the second region 4 is formed at a portion extending from the N-type epitaxial layer 14 positioned under the LOCOS oxide film 21 to an upper layer of the silicon substrate 11.

A first semiconductor layer 31 of a first conduction type (P-type) is formed on the semiconductor base body 10 in the first region 2. The first semiconductor layer 31 is formed of a semiconductor material which is higher in carrier mobility than silicon. For example, mixed crystals of silicon-germanium ($Si_{1-x}Ge_x$), preferably $0.05 \leq x \leq 0.3$, for example x=0.15. In addition, the first semiconductor layer 31 is not formed on the $N^+$-type collector contact region 22. An emitter region 33 comprised of a second semiconductor layer 32 of a second conduction type ($N^+$-type) is formed on a portion of the first semiconductor layer 31. The second semiconductor layer 32 is typically formed of an $N^+$-type silicon layer. Emitter side walls 41 are formed on side walls of the emitter region 33. $P^+$-type graft base regions 34 are formed in the first semiconductor layer 31 on both sides of the emitter region 33 via the emitter side walls 41, with a portion of the first semiconductor layer 31 between the graft base regions 34 taken as a base region (intrinsic base region) 35.

On the other hand, a semiconductor layer 31 of the first conduction type (P-type), which is the same as the P-type semiconductor layer 31 formed in the first region 2, is formed on the semiconductor base body 10 in the second region 4. The first semiconductor layer 31 in the second region 4 is also formed of a semiconductor material which is higher in carrier mobility than silicon. For example, mixed crystals of silicon-germanium ($Si_{1-x}Ge_x$), preferably $0.05 \leq x \leq 0.3$. A second semiconductor layer 32 of a second conduction type ($N^+$-type), which is the same as the $N^+$-type second semiconductor layer 32 formed in the first region 2, is formed on a portion of the first semiconductor layer 31, and a gate region 36 is formed of the second semiconductor layer 32. That is, the gate region 36 is also formed of the $N^+$-type silicon layer. Gate side walls 42 are formed on side walls of the gate region 36. Source/drain regions 37, 38 are formed in the first semiconductor layer 31 on both sides of the gate region 36 via the gate side walls 42, with a portion of the first semiconductor layer 31 between the source/drain regions 37, 38 taken as a channel region 39.

A silicon oxide film 71 is then formed over the entire surface, and it is etched to have contact holes 72 to 74 respectively communicated to the emitter region 33, one of the graft base regions 34, and collector contact region 22, and also to have contact holes 75 to 77 respectively communicated to the gate region 36 and source/drain regions 37, 38. Interconnections (or electrodes) 78 to 83 are then formed in the contact holes 72 to 77, respectively.

In the above semiconductor device 1, when the base region 35 of the heterojunction bipolar transistor 3 is formed of the first semiconductor layer 32 of the first conduction type which is made of a semiconductor material which is higher in carrier mobility than silicon, the channel region 39 of the junction gate type field effect transistor 5 is similarly formed of the same first semiconductor layer 32. Consequently, as compared with the channel region which has been formed of a silicon layer in accordance with the related art process, the channel resistance becomes lower and the mutual conductance gm becomes higher. Thus, the junction gate type field effect transistor 5 can exhibit a high amplitude ratio.

In this embodiment, the first semiconductor layer 31 is formed of mixed crystals of silicon-germanium as the semiconductor material which is higher in carrier mobility than silicon (single crystal silicon). The use of a semiconductor material containing germanium (Ge), that is, a Si—Ge mixture($Si_{1-x}Ge_x$) is effective at increasing the carrier mobility. This is because the mobility of electrons in germanium is 3900 $cm^2$/Vs which is higher than the mobility of electrons in silicon (1350 $cm^2$/Vs) and the mobility of positive holes in germanium is 1900 $cm^2$/Vs which is higher than the mobility of positive holes in silicon (480 $cm^2$/Vs).

Figure 2:
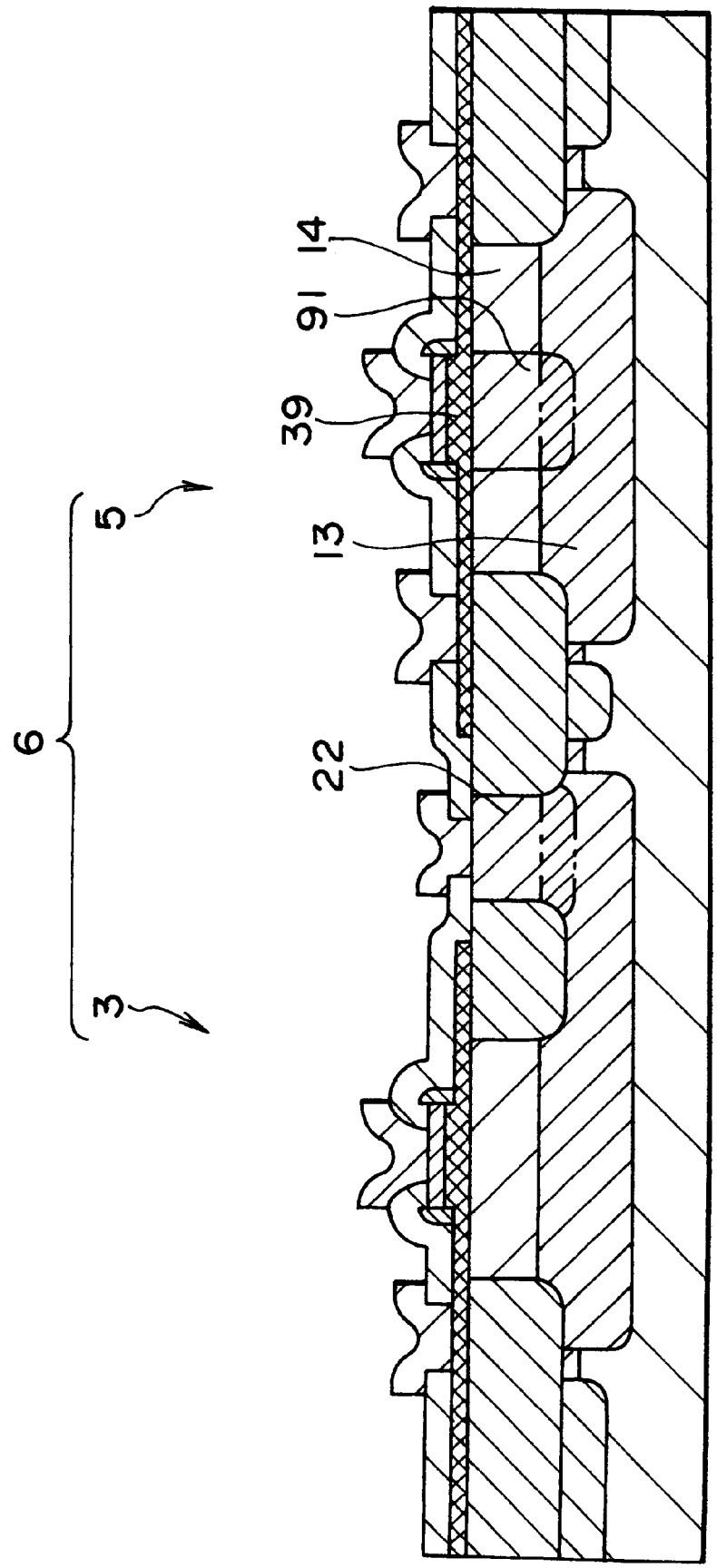
FIG. 2 is a sectional view which illustrates a schematic configuration of a second embodiment of the semiconductor device of the present invention.

Next, a second embodiment of the semiconductor device of the present invention will be described with reference to a schematic sectional configuration of the second embodiment shown in FIG. 2. In FIG. 2, parts corresponding to those in the first embodiment described with reference to FIG. 1 are indicated by the same reference numerals for convenience.

Like the semiconductor device 1 described with reference to FIG. 1, the semiconductor device 6 shown FIG. 2 includes a heterojunction bipolar transistor 3 and a junction gate type field effect transistor 5. In the second embodiment, a heavily doped diffusion layer 91 of the second conduction type ($N^+$-type) connected to an $N^+$-type buried diffusion layer 13 is formed in an N-type epitaxial layer 14 at a position under a channel region 39 of the junction gate type field effect transistor 5. The other parts of the semiconductor device 6 are the same as those of the semiconductor device 1, and therefore, the explanation thereof is omitted.

The heavily doped diffusion layer 91 of $N^+$-type is formed simultaneously with formation of a collector contact region 22 of the heterojunction bipolar transistor 3, and thereby it is formed in a state extending from the surface of the N-type epitaxial layer 14 to the $N^+$-type buried diffusion layer 13. In the case where the heterojunction bipolar transistor 3 has a so-called SIC (Selective Ion-implantation Collector) structure in which a heavily doped diffusion collector region is formed in the N-type epitaxial layer 14, the $N^+$-type heavily doped diffusion layer 91 may be formed simultaneously with formation of the heavily doped diffusion collector region. In this case, while not shown, the $N^+$-type heavily doped diffusion layer 91 is formed in a state extending from the interior of the N-type epitaxial layer 14 to the $N^+$-type buried diffusion layer 13.

In the semiconductor device 6, the N-type epitaxial layer 14 forms a lower gate region of the junction gate type field effect transistor 5, like the semiconductor device 1 described with reference to FIG. 1. Since the heavily doped diffusion layer 91 of the second conduction type ($N^+$-type) is formed in the N-type epitaxial layer 14 forming the lower gate region, a lower gate effect is increased more than that of the semiconductor device 1 in the first embodiment, to thereby give a high mutual conductance gm. According to the second embodiment, therefore, the junction gate field effect transistor 5 can exhibits a higher amplitude ratio.

Next, a first embodiment of a process of fabricating a semiconductor device according to the present invention will be described with reference to fabrication steps shown in FIG. 3A to FIG. 3K. In these figures, there is shown a semiconductor device in which a heterojunction NPN bipolar transistor and a junction gate type field effect transistor are formed on the same semiconductor base body. Parts, shown in these figures, corresponding to those of the first embodiment of the semiconductor device described with reference to FIG. 1 are indicated by the same reference numerals. In each figure, the heterojunction NPN bipolar transistor is shown on the left side and the junction gate type field effect transistor is shown on the right side.

Figure 3A:
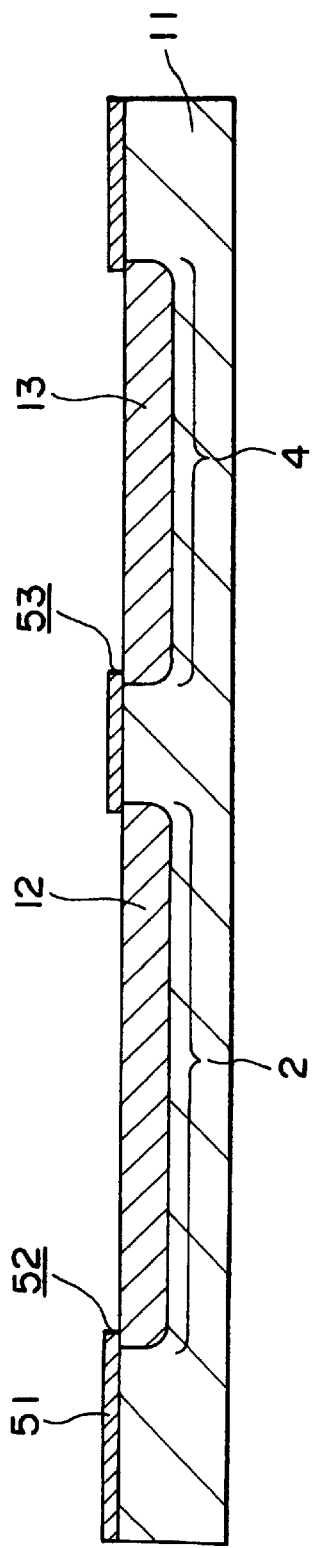

At a step shown in FIG. 3A, a silicon oxide film 51 is formed on the surface of a silicon substrate 11 by steam oxidization at a temperature of about 900° C. to 1000° C. to a thickness of, for example, about 300 nm. A resist mask (not shown), provided with an opening positioned over a region in which an $N^+$-type buried diffusion layer is to be formed, is formed by lithography. The silicon oxide film 51 is then etched using the resist mask to have windows 52, 53 respectively positioned over a first region 2 which will be taken as a heterojunction NPN bipolar transistor forming region and over a second region 4 which will be taken as a junction gate type field effect transistor forming region. The resist mask is then removed.

The silicon substrate 11 is diffused with antimony (Sb) through the windows 52, 53 at a temperature of about 1100° C. to 1250° C. using a solid diffusion source such as antimony oxide ($Sb_2O_3$), to form $N^+$-type buried diffusion layers 12, 13. The $N^+$-type diffusion layer 12 is taken as a collector region. The silicon oxide film 51 is then removed by etching.

Figure 3B:
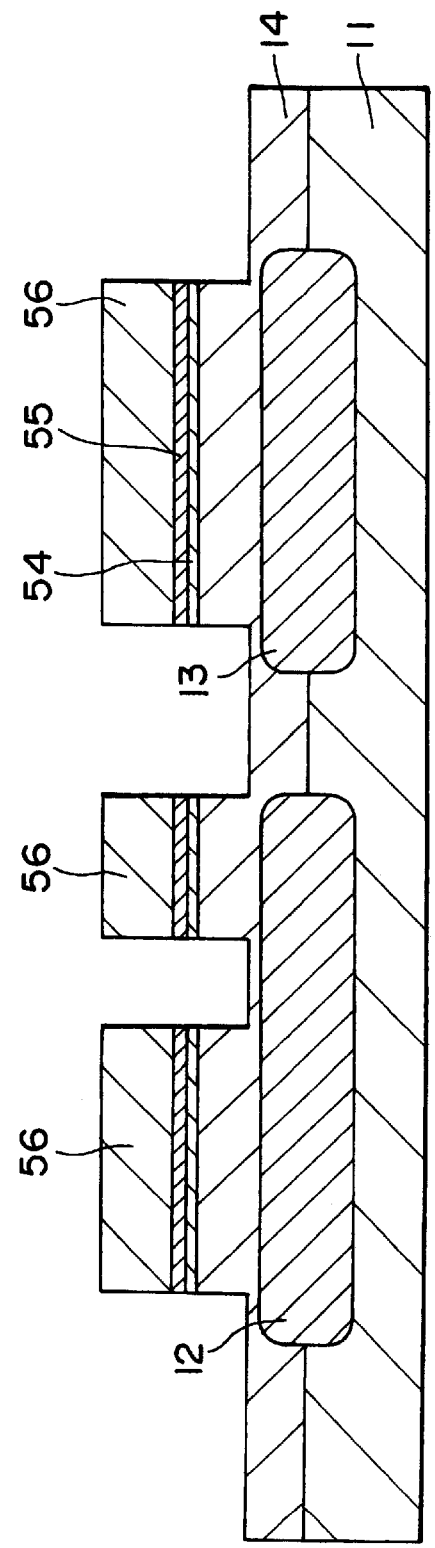

At the next step shown in FIG. 3B, an N-type expitaxial layer 14 is formed over the entire surface of the silicon substrate 11 to a thickness of about 0.7 μm to 2 μm by epitaxial growth. The N-type epitaxial layer 14 has, for example, a resistivity of about 0.3 Ω.cm to 5Ω cm. In formation of the N-type epitaxial layer 14, the $N^+$-type buried diffusion layers 12, 13 are also diffused in a lower portion of the N-type epitaxial layer 14.

A pad silicon oxide film 54, which will be taken as a buffer layer upon formation of an isolation region by LOCOS is formed on the surface of the N-type epitaxial layer 14 to a thickness of, for example, 10 nm to 15 nm. Subsequently, a silicon nitride film 55, which will be taken as a mask used for LOCOS, is formed by chemical vapor deposition (hereinafter, referred to as "CVD") on the pad silicon oxide film 54 to a thickness of, for example, 50 nm to 70 nm.

A resist mask 56, having openings positioned over regions to be oxidized by LOCOS, is formed on the silicon nitride film 55 by lithography. That is, the resist mask 56 covers regions which will be taken as a base region and a collector contact region in the first region and the entire second region. The silicon nitride film 55, pad silicon oxide film 54, and N-type epitaxial layer 14 are etched using the resist mask 56 by a known etching technique such as RIE.

The etched amount of the N-type epitaxial layer 14 is desired to be about one-half the thickness of a field oxide film which will be formed later by LOCOS in order that surface portions of the epitaxial layer 14 and the field oxide film are planarized after formation of the field oxide film by LOCOS.

The resist mask 56 is then removed. The process goes on to a step shown in FIG. 3C, in which a LOCOS oxide film 21 is formed on the N-type epitaxial layer 14 by steam oxidation at a temperature of 950° C. to 1100° C. The thickness of the LOCOS oxide film 21 is set to be about twice the etched depth of the N-type epitaxial layer 14, for example, within a range of 0.6 $\mu$m to 1.2 $\mu$m. The silicon nitride film 55 is then removed by wet-etching using hot phosphoric acid.

In addition, to planarized bird heads formed by LOCOS, a silicon oxide film (not shown) is formed by CVD and a resist film (not shown) is formed by coating a resist on the silicon oxide film. This is followed by etching-back using RIE, to thereby planarize surface portions of the N-type epitaxial layer 14 and the LOCOS oxide film 21 as shown in FIG. 3C. The pad silicon oxide film 54 is also removed by the above etching-back. The semiconductor base body 10 is thus formed.

At a step shown in FIG. 3D, a resist mask (not shown) having an opening positioned over a collector contact region of the heterojunction bipolar transistor is formed by lithography, and the N-type epitaxial layer 14 is doped with phosphorus (P) using the resist mask by ion implantation. The ion implantation is performed in a dose of, for example, $5 \times 10^{15}$ ions/cm$^2$ to $2 \times 10^{16}$ ions/cm$^2$ and an implantation energy of 40 keV to 80 keV. The resist mask is removed, followed by heat treatment at a temperature of about 950° C. to 1100° C., to diffuse ions of phosphorus thus implanted, thus forming an N$^+$-type collector contact region 22 connected to the N$^+$-type buried diffusion layer 12.

Next, a resist mask (not shown) covering the first region 2 and the second region 4 is formed by lithography, followed by ion implantation of Boron (B$^+$) ions using the resist mask. The ion implantation is performed at a dose of $5 \times 10^{13}$ ions/cm$^2$ to $5 \times 10^{14}$ ions/cm$^2$ and an implantation energy of 340 keV to 380 keV.

The resist mask is then removed, followed by heat treatment at a temperature of about 900° C. to 1000° C., to diffuse ions of boron thus implanted, thus forming a P$^+$-type isolation region 23 at a portion extending from the N$^+$-type epitaxial layer 14 positioned under the LOCOS oxide film 21 to an upper layer of the silicon substrate 11. The silicon oxide film (not shown) formed on the N-type epitaxial layer 14 is removed by wet-etching using hot phosphoric acid, to clean the surface of the N-type epitaxial layer 14.

The process goes on to a first step which is characteristic of the first embodiment. At the first step shown in FIG. 3E, a first semiconductor layer 31 of a first conduction type (P-type) which is comprised of a semiconductor material which is higher in carrier mobility than silicon is formed on the semiconductor base body 10 using a film formation process such as a molecular beam epitaxy process (hereinafter, referred to as a "MBE"), gas source MBE process, ultra-high vacuum CVD process (hereinafter, referred to as a "UHV-CVD"), or a LP-CVD process. The semiconductor layer 31 is typically formed of mixed crystals of P-type silicon-germanium (Si$_{1-x}$Ge$_x$), preferably $0.05 \leq x \leq 0.3$, for example x=0.15.

An N-type second semiconductor layer 32 is formed on the first semiconductor layer 31 by continuous expitaxial growth. The second semiconductor layer 32 is typically formed of an N$^+$-type silicon layer. Subsequently, a silicon nitride film 57 is formed on the second semiconductor layer 32 by, for example, low pressure CVD (hereinafter, referred to as "LP-CVD") to a thickness of, for example, 50 nm to 60 nm. In this case, the thickness of the silicon nitride film 57 is set at a value which allows the silicon nitride film 57 to be used as a mask in the subsequent etching step for forming side walls or in the subsequent ion implantation step for forming graft base regions of the heterojunction bipolar transistor and source/drain regions of the junction gate type field effect transistor.

The process goes on to a second step which is characteristic of the first embodiment. At the second step, a resist mask 58 covering an emitter region of the heterojunction bipolar transistor and a gate region of the junction gate type field effect transistor is formed by lithography, and the silicon nitride film 57 and the second semiconductor layer 32 are sequentially etched using the resist mask 58 by, for example, RIE.

Thus, as shown in FIG. 3F, an emitter region 33 and a gate region 36 are formed of the second semiconductor layer 32. The patterned silicon nitride film 57 remains on each of the emitter region 33 and the gate region 36. In the above etching, since the second semiconductor layer 32 is over-etched, the surface portion of the first semiconductor layer 31 is also etched, and thereby the thickness of the first semiconductor layer 31 is reduced. The resist mask 58 is then removed.

Next, at a step shown in FIG. 3G, a resist mask (not shown) covering a base region and graft base regions of the heterojunction bipolar transistor and a channel region and source/drain electrode regions of the junction gate type field effect transistor is formed by lithography. Subsequently, the first semiconductor layer 31 is etched using the resist mask to remove a portion of the first semiconductor layer 31 positioned on the N$^+$-type collector contact region 22 and separate the remaining first semiconductor layer 31 into portions positioned on the above regions.

The process goes on to a third step which is characteristic of the first embodiment. At the third step, a silicon oxide film 59 is formed over the entire surface of the semiconductor base body 10 by CVD to a thickness of, for example, 300 nm to 500 nm.

Next, as shown in FIG. 3H, the silicon oxide film 59 is etched-back by, for example, RIE, to form emitter side walls 41 on side walls of both the emitter region 33 and the silicon nitride film 57 formed thereon, and to form gate side walls 42 on side walls of both the gate region 36 and the silicon nitride film 57 formed thereon.

The process goes on to a fourth step, in which a resist mask 62 having openings 60, 61 is formed on the first semiconductor film 31 by lithography. The resist mask 62 covers the N$^+$-type collector contact region 22 such that the opening 60 is positioned over the base region and the graft base regions of the heterojunction bipolar transistor while the opening 61 is positioned over the channel region and the source/drain electrode regions of the junction gate type field effect transistor. The first semiconductor layer 31 is then doped with boron (B$^+$) ions or boron difluoride (BF$_2^+$) ions using the resist mask 62 by ion implantation. In this ion implantation, the silicon oxide film 57, emitter side walls 41, and gate side walls 42 function as masks, so that the emitter region 33 and the gate region 36 are not doped with boron (B$^+$) ions or boron difluoride (BF$_2^+$) ions. The above ion implantation is performed in a dose of, for example, about $5\times10^{14}$ ions/cm$^2$ to $5\times10^{15}$ ions/cm$^2$ and an implantation energy of 10 keV to 30 keV.

Graft base regions 34 of the heterojunction bipolar transistor are formed in the first semiconductor layer 31 on both sides of the emitter region 33 via the emitter side walls 41, with a portion of the first semiconductor layer 31 between the graft base regions 34 taken as a base region 35. At the same time, source/drain regions 37, 38 of the junction gate type field effect transistor are formed in the first semiconductor layer 31 on both sides of the gate region 36 via the gate side walls 42, with a portion of the first semiconductor layer 31 between the source/drain regions 37, 38 taken as a channel region 39.

In the above ion implantation, it is possible to reduce a resistivity of each of the graft base regions and the source/drain regions which is increased resulting from reduction in film thickness of the first semiconductor layer 31 caused by over-etching of the second semiconductor layer 32 upon etching the second semiconductor layer 32. The resist mask 62 is then removed. Subsequently, the silicon nitride film 57 is removed by wet-etching using hot phosphoric acid, to expose the emitter region 33 and the gate region 36 as shown in FIG. 3I. Next, at a step shown in FIG. 3J, a silicon oxide film 71 is formed to a thickness of, for example, about 300 nm to 500 nm covering the emitter region 33, graft base regions 34, gate region 36, and source/drain regions 37, 38, followed by heat treatment at a temperature of about 900° C. to 1000° C.

Subsequently, a resist mask (not shown) having electrode forming windows positioned over the emitter region 33, graft base regions 34, gate region 36, source/drain regions 37, 38 are formed on the silicon oxide film 71 by lithography.

Figure 3K:
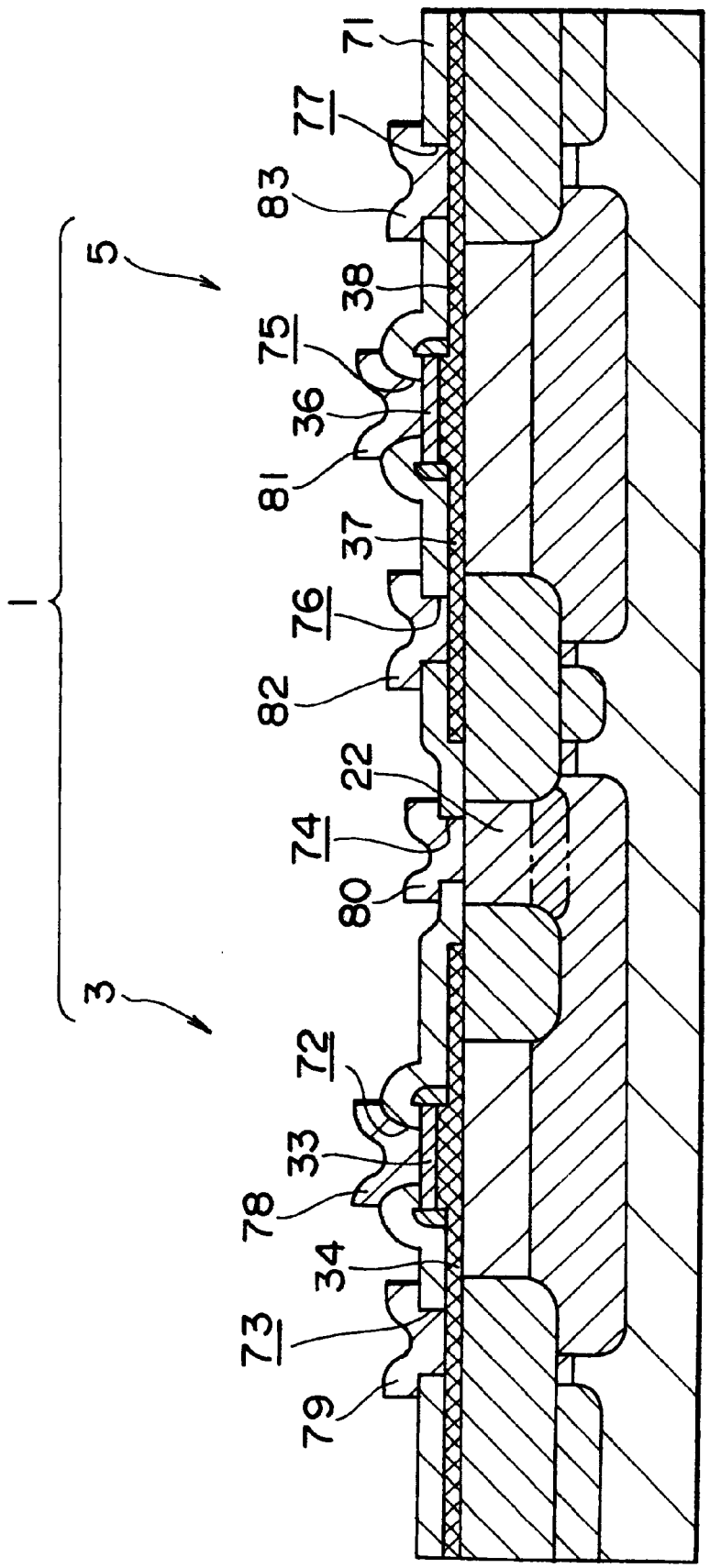

As shown in FIG. 3K, the silicon oxide film 71 is etched using the resist mask by, for example, RIE, to have contact holes 72 to 74 respectively communicated to the emitter region 33, one of the graft base region 37, and collector contact region 22, and to have contact holes 75 to 77 respectively communicated to the gate region 36, and source/drain regions 37, 38.

The process goes on to a step shown in FIG. 3K, in which a barrier metal layer of titanium (Ti)/titanium oxide-nitride (TiON)/titanium (Ti) and an aluminum based metal layer having a thickness of about 0.6 μm to 0.8 μm are formed by sputtering (not shown). Then, a resist mask (not shown) is formed on a region in which interconnections are to be formed by lithography, and the barrier metal layer and the aluminum based metal layer are etched using the resist mask by, for example, RIE, to form interconnections (electrodes) 78 to 83. The semiconductor device 1 including the heterojunction bipolar transistor 3 and the junction gate type field effect transistor 5 is thus formed.

According to the first embodiment of the fabrication process of the present invention, the emitter region 33 of the heterojunction bipolar transistor 3 and the gate region 36 of the junction gate type field effect transistor 5 are formed in the same step by etching the second semiconductor layer 32 having the second conduction type; the emitter side walls 41 and the gate side walls 42 are formed in the same step; and the graft base regions 34 and the source/drain regions 37, 38 are formed in the same step. Accordingly, it is possible to form the heterojunction bipolar transistor 3 and the junction gate type field effect transistor 5 on the same semiconductor base body 10 without the addition of any new step.

Since the channel region 39 of the junction gate type field effect transistor 5 is formed of the first semiconductor layer 31 of the first conduction type which is made of a semiconductor material which is higher in carrier mobility than silicon, the channel resistance becomes lower and the mutual conductance gm becomes higher, so that the junction gate type field effect transistor 5 can exhibit a high amplitude ratio.

In the heterojunction bipolar transistor 3, the N-type epitaxial layer 14 at the portion under the base region 35 becomes a (lightly doped) collector region and the N$^+$-type buried diffusion layer 12 becomes a (heavily doped) collector region. On the other hand, in the junction gate field effect transistor 5, the N-type epitaxial layer 14 at the portion under the channel region 39 becomes a lower gate region.

Further, since the first semiconductor layer 31 of the first conduction type is formed of mixed crystals of silicon-germanium as a semiconductor material containing germanium (Ge), it becomes higher in carrier mobility than that of the layer which has been made of single crystal silicon in the related art process. The use of a Si—Ge mixture(Si$_{1-x}$Ge$_x$) is effective at increasing the carrier mobility because the mobility of electrons in germanium is 3900 cm$^2$/Vs which is higher than the mobility of electrons in silicon (1350 cm$^2$/Vs) and the mobility of positive holes in germanium is 1900 cm$^2$/Vs which is higher than the mobility of positive holes in silicon (480 cm$^2$/Vs).

Next, a second embodiment of the process of fabricating a semiconductor device of the present invention will be described with reference to FIGS. 4A to 4D. In these figures, parts corresponding to those in the first embodiment of the fabrication process shown in FIG. 3A to 3K are indicated by the same numerals.

First, as shown in FIG. 4A, N$^+$-type buried diffusion layers 12, 13 are formed in a silicon substrate 11 and an N-type epitaxial layer 14 is formed over the entire surface of the silicon substrate 11 in the same manner as that in the first embodiment of the fabrication process shown in FIG. 3A to 3C. The N-type epitaxial layer 14 becomes a (lightly doped) collector region in a first region, and becomes a lower gate region in a second region 4. Next, a LOCOS oxide film 21 is formed on the N-type epitaxial layer 14. A semiconductor base body 10 is thus formed. It should be noted that surface portions of the N-type epitaxial layer 14 and the LOCOS oxide film 21 may be planarized as shown in FIG. 4A.

At the next step shown in FIG. 4B, a resist mask (not shown) having windows positioned over regions which will be taken as a collector contact region of a heterojunction bipolar transistor and a gate region of a junction gate type field effect transistor is formed by lithography, and the N-type epitaxial layer 14 is doped with phosphorus (P$^+$) ions using the resist mask by ion implantation. The ion implantation is performed at a dose of, for example, about $5\times10^{15}$ ions/cm$^2$ to $2\times10^{16}$ ions/cm$^2$, and an implantation energy of 40 keV to 80 keV.

The resist mask is removed, followed by heat treatment at a temperature of about 950° C. to 1100° C., to diffuse the ions of phosphorus thus implanted, thus forming an N$^+$-type collector contact region 22 connected to the N$^+$-type buried diffusion layer 12. At the same time, an N$^+$-type heavily doped diffusion layer 91 connected to the N$^+$-type buried diffusion layer 13 is formed in the N-type epitaxial layer 14 at a region which will be taken as a lower gate region, at an impurity concentration higher than the N-type epitaxial layer 14, for example, the impurity concentration of the N$^+$-type heavily doped diffusion layer 91 is $1\times10^{18}$ to $1\times10^{20}/cm^3$.

A resist mask (not shown) covering the first region 2 and the second region 4 is then formed by lithography, followed by ion implantation of boron (B$^+$) ions using the resist mask for isolating the first region 2 from the second region 4. The ion implantation is performed at a dose of, for example, about $5\times10^{13}$ ions/cm$^2$ to $5\times10^{14}$ ions/cm$^2$, and an implantation energy of 340 keV to 380 keV.

The resist mask is removed, followed by heat treatment at a temperature of about 900° C. to 1000° C., to diffuse the ions of boron thus implanted, thus forming a P$^+$-type isolation region 23 for isolating the first region 2 from the second region 4 at a portion extending from the N-type epitaxial layer 14 positioned under the LOCOS oxide film 21 to an upper layer of the silicon substrate 11. The silicon oxide film (not shown) formed on the N-type epitaxial layer 14 is removed by hydrofluoric acid based chemical, to clean the surface of the N-type epitaxial layer 14.

Then, the steps of the first embodiment of the fabrication process shown in FIG. 3E to 3K will be repeated. Specifically, as shown in FIG. 4C, a first semiconductor layer 31 of the first conduction type (P-type) is typically formed of mixed crystals of P-type silicon-germanium (Si$_{1-x}$Ge$_x$) preferably $0.05 \leq x \leq 0.3$, for example x=0.15, on the semiconductor base body 10, and a second semiconductor layer 32 of the second conduction type (N-type) is typically formed of an N$^+$-type silicon layer on the first semiconductor layer 31. A silicon nitride film 57 is then formed on the second semiconductor layer 32.

A resist mask 58 covering an emitter region of the heterojunction bipolar transistor and a gate region (N$^+$-type heavily doped diffusion layer 91) of the junction gate type field effect transistor is formed by lithography, and the silicon nitride film 57 and the second semiconductor layer 32 are sequentially etched using the resist mask by, for example, RIE.

As a result, as shown in FIG. 4D, an emitter region 33 and a gate region 36 are formed of the second semiconductor layer 32. While not shown, the silicon nitride film 57 remains on each of the emitter region 33 and the gate region 36. The first semiconductor layer 31 is patterned by lithography and etching in such a manner as to be left at regions which will be the base region and graft base regions of the heterojunction bipolar transistor. It will also be left at a portion which will be a channel region of the junction gate type field effect transistor.

A silicon oxide film is formed, followed by etching-back thereof, to form emitter side walls 41 on side walls of both the emitter region 33 and the silicon nitride film (not shown) formed thereon, and to form gate side walls 42 on side walls of both the gate region 36 and the silicon nitride film (not shown) formed thereon.

Graft base regions 34 are formed in the first semiconductor layer 31 on both sides of the emitter 33 via the emitter side walls 41, with a portion of the first semiconductor layer 31 between the graft base regions 34 taken as a base region 35. At the same time, source/drain regions 37, 38 are formed in the first semiconductor layer 31 on both sides of the gate region 36 via the gate side walls 42, with a portion of the first semiconductor layer 31 between the source/drain regions 37, 38 taken as a channel region 39.

A silicon oxide film 71 is formed, followed by heat treatment at a temperature of about 900° C. to 1000° C., and is etched to have contact holes 72 to 74 respectively communicated to the emitter region 33, one of the graft base regions 34, and collector contact region 22, and to have contact holes 75 to 77 respectively communicated to the gate region 36 and source/drain regions 37, 38. Then, interconnections (or electrodes) 78 to 83 are formed in the contact holes 72 to 77, respectively. A semiconductor device 6 including the heterojunction bipolar transistor 3 and the junction gate type field effect transistor 5 is thus formed.

According to the second embodiment of the fabrication process of the present invention, the N$^+$-type heavily doped diffusion layer 91 which is higher in impurity concentration than the N-type expitaxial layer 14 is formed in the N-type epitaxial layer 14 at the region which is taken as the lower gate region, so that the lower gate effect is increased and thereby a high mutual conductance gm can be obtained. Therefore, the junction gate type field effect transistor 5 can exhibit a high amplitude ratio. Further, since the N$^+$-type heavily doped diffusion layer 91 is formed simultaneously with formation of the collector contact region 22, it is not required to add a new step of forming only the N$^+$-type heavily doped diffusion layer 91.

A third embodiment of the process of fabricating a semiconductor device according to the present invention will be described with reference to FIGS. 5A to 5D. In these figures, parts corresponding to those in the first embodiment of the fabrication process shown in FIG. 3A to 3K are indicated by the same numerals.

As shown in FIG. 5A, N$^+$-type buried diffusion layers 12, 13 are formed in a silicon substrate 11 and an N-type epitaxial layer 14 is formed on the entire surface of the silicon substrate 11 in the same manner as that in the steps of th e first embodiment of the fabrication process shown in FIG. 3A to 3C. Then a LOCOS oxide film 21 is formed on the N-type epitaxial layer 14. A semiconductor base body 10 is thus formed. It should be noted that surface portions of the N-type epitaxial layer 14 and the LOCOS oxide film 21 may be planarized as shown in FIG. 5A.

At a step shown in FIG. 5B, A region which will be taken as a collector region in the semiconductor base body 10 is doped with phosphorus (P$^+$)ions by lithography and ion implantation. The ion implantation is performed as a dose of, for example, about $5\times10^{15}$ ions/cm$^2$ to $2\times10^{16}$ ions/cm$^2$ and an implantation energy of 40 keV to 80 keV. The resist mask is then removed.

A resist mask (not shown) having windows positioned over a base region of the heterojunction bipolar transistor and a channel region of the junction gate type field effect transistor is formed by lithography, and the semiconductor base body 10 is doped with phosphorus (P$^+$) ions using the resist mask by ion implantation. The ion implantation is performed at a dose of, for example, about $1\times10^{13}$ ions/cm$^2$ to $1\times10^{14}$ ions/cm$^2$. The resist mask is then removed.

The semiconductor base body 10 is then subjected to heat treatment at a temperature of about 900° C. to 1000° C., to diffuse ions of phosphorus thus implanted, thus forming an N$^+$-type collector contact region 22 extending to the surface of the N-type epitaxial layer 14 to the N$^+$-type buried diffusion layer 12 and connected to the N$^+$-type buried diffusion 12, and to form an N⁺-type heavily doped diffusion layer 92 connected to the N⁺-type buried diffusion layer 12 in the N-type epitaxial layer 14 at a portion under the base region. Further, an N⁺-type heavily doped diffusion layer 91 connected to the N⁺-type buried diffusion layer 13 is formed in the N-type epitaxial layer 14 at a portion under the channel region. The above heavily doped diffusion layer 92 is generally called a "SIC".

A resist mask (not shown) covering the first region 2 and the second region 4 is formed by lithography, followed by ion implantation of boron (B⁺) ions using the resist mask for isolating the first region 2 from the second region 4. The ion implantation is performed at a dose of, for example, about $5\times10^{13}$ ions/cm² to $5\times10^{14}$ ions/cm², and an implantation energy of 340 keV to 380 keV.

The resist mask is removed, followed by heat treatment at a temperature of about 900° C. to 1000° C., to diffuse the ions of boron thus implanted, whereby forming a P⁺-type isolation region 23 for isolating the first region 2 from the second region 4 at a portion extending from the N-type epitaxial layer 14 positioned under the LOCOS oxide film 21 to an upper layer of the silicon substrate 11. The silicon oxide film (not shown) formed on the N-type epitaxial layer 14 is removed by a hydrofluoric acid based chemical, to clean the surface of the N-type epitaxial layer 14.

Figure 5C:
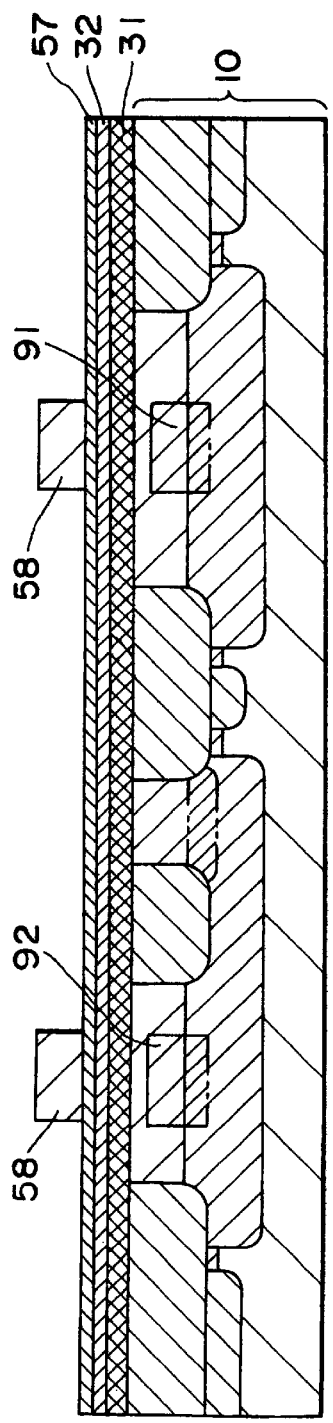

Then, the steps of the first embodiment of the fabrication process shown in FIG. 3E to 3K will be performed. Specifically, as shown in FIG. 5C, a first semiconductor layer 31 of the first conduction type (P-type) is typically formed of mixed crystals of P-type silicon-germanium ($Si_{1-x}Ge_x$) on the semiconductor base body 10, and a second semiconductor layer 32 of the second conduction type (N-type) is typically formed of an N⁺-type silicon layer on the first semiconductor layer 31. A silicon nitride film 57 is then formed on the second semiconductor layer 32.

A resist mask 58 covering an emitter region (or the N⁺-type heavily doped diffusion layer 92) of the heterojunction bipolar transistor and a gate region (or N⁺-type heavily doped diffusion layer 91) of the junction gate type field effect transistor is formed by lithography, and the silicon nitride film 57 and the second semiconductor layer 32 are sequentially etched using the resist mask 58 by, for example, RIE.

Figure 5D:
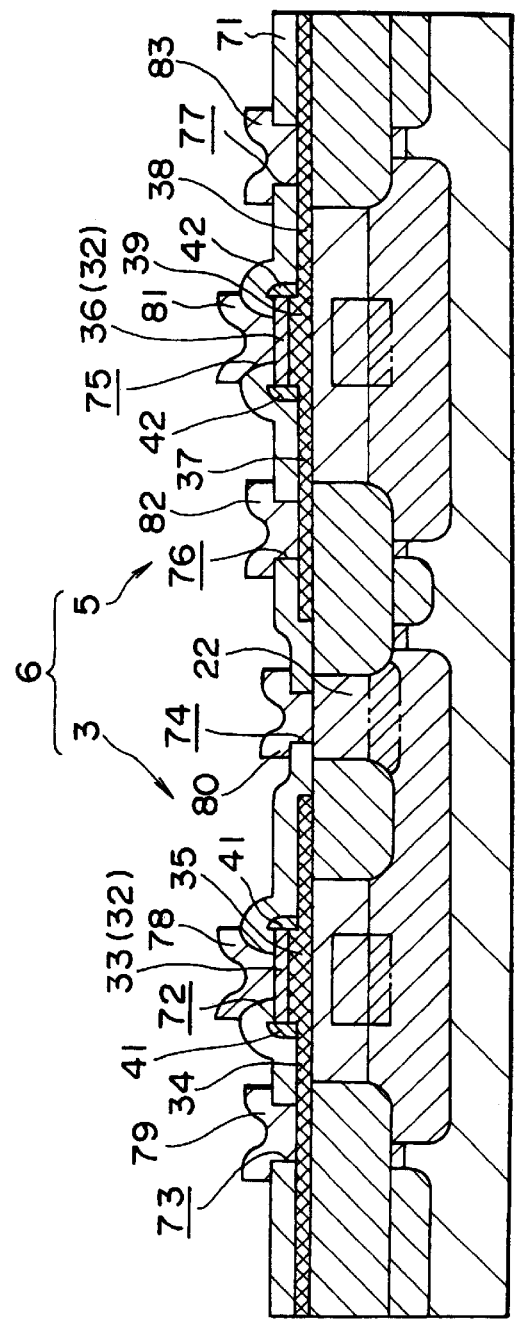

An emitter region 33 and a gate region 36 are thus formed of the second semiconductor layer 32 as shown in FIG. 5D. While not shown, in the above etching, the silicon nitride film 57 remains on each of the emitter region 33 and the gate region 36.

The first semiconductor layer 31 is patterned by lithography and etching in such a manner as to be left at region which will be taken as a base region and graft base regions of the heterojunction bipolar transistor and to be left at a region which will be taken as a channel region of the junction gate field effect transistor.

Next, a silicon oxide film is formed, followed by etching-back thereof, to form emitter side walls 41 on side walls of both the emitter region 33 and the silicon nitride film (not shown) formed thereon, and to form gate side walls 42 on side walls of both the gate region 36 and the silicon nitride film (not shown) formed thereon.

Subsequently, graft base regions 34 are formed in the first semiconductor layer 31 on both sides of the emitter region 33 via the emitter side walls 41, with a portion of the first semiconductor layer 31 between the graft base regions 34 taken as a base region 35. At the same time, source/drain regions 37, 38 are formed in the first semiconductor layer 31 on both sides of the gate region 36 via the gate side walls 42, with a portion of the first semiconductor layer 31 between the source/drain regions 37, 38 taken as a channel region 39.

A silicon oxide film 71 is then formed, followed by heat treatment at a temperature of about 900° C. to 1000° C., and is etched to have contact holes 72 to 74 respectively communicated to the emitter region 33, at least one of the graft base regions 34, and collector contact region 22, and to have contact holes 75 to 77 respectively communicated to the gate region 36 and source/drain region 37, 38. Then, interconnections (or electrodes) 78 to 83 are formed in the contact holes 72 to 77, respectively. A semiconductor device 6 having the heterojunction bipolar transistor 3 and the junction gate field effect transistor 5 is thus formed.

According to the third embodiment of the fabrication process of the present invention, since the N⁺-type heavily doped diffusion layer 91 which is higher in impurity concentration, for example $1\times10^{18}$ to $1\times10^{20}$/cm³, than the N-type expitaxial layer 14 is formed in the N-type epitaxial layer 14 at the region which is the lower gate region, the lower gate effect is increased and thus a high mutual conductance gm can be obtained. Therefore, the junction gate type field effect transistor 5 can exhibit a high amplitude ratio.

Further, since the N⁺-type heavily doped diffusion layer 91 is formed simultaneously with formation of the N⁺-type heavily doped diffusion layer 92 which is taken as the SIC region, it is not necessary to add a new step of forming only the N⁺-type heavily doped diffusion layer 91.

Next, a fourth embodiment of the process of fabricating a semiconductor device according to the present invention will be described with reference to FIGS. 6A to 6D. In these figures, parts corresponding to those in the first and second embodiment of the fabrication process shown in FIG. 3A to 3K are indicated by the same reference numerals.

The steps of the second embodiment shown in FIGS. 4A to 4B and the steps of the first embodiment shown in FIGS. 3E to 3F will be performed. Specifically, as shown in FIG. 6A, N⁺-type buried diffusion layers 12, 13 are formed in a silicon substrate 11, and an N-type epitaxial layer 14 is formed on the entire surface of the silicon substrate 11. Next, a LOCOS oxide film 21 is formed on the N-type epitaxial layer 14. A semiconductor base body 10 is thus formed. It is to be noted that surface portions of the N-type epitaxial layer 14 and the LOCOS oxide film 21 may be planarized as shown in FIG. 6A.

After that, an N⁺-type collector contact region 22 connected to the N⁺-type buried diffusion layer 12 is formed by selective ion implantation in the N-type epitaxial layer 14 in a first region at an impurity concentration higher than that of the N-type epitaxial layer 14. At the same time, an N⁺-type heavily doped diffusion layer 91 connected to the N⁺-type buried diffusion layer 13 is formed by selective ion implantation in the N-type epitaxial layer 14 at a portion which is a lower gate region in a scond region 4 at an impurity concentration higher than that of the N-type epitaxial layer 14.

Next, a P⁺-type isolation region 23 for isolating the first region 2 from the second region 4 is formed at a portion extending from the N-type epitaxial layer 14 positioned under the LOCOS oxide film 21 to an upper layer of the silicon substrate 11. The silicon oxide film (not shown) formed on the N-type epitaxial layer 14 is then removed by hydrofluoric acid based chemical, to clean the surface of the N-type epitaxial layer 14.

A first semiconductor layer 31 of the first conduction type (P-type) is typically formed of mixed crystals of P-type silicon-germanium($Si_{1-x}Ge_x$), for preferably $0.05 \leq x \leq 0.3$, for example x=0.015 on the semiconductor base body 10, and a second semiconductor layer 32 of the second conduction type (N-type) is typically formed of an $N^+$-type silicon layer on the first semiconductor layer 31. A silicon nitride film 57 is formed on the second semiconductor layer 32.

The second semiconductor layer 32 is patterned by lithography and etching, to form an emitter region 33 and a gate region 36. The gate region 36 is formed over the $N^+$-type heavily doped diffusion layer 91. In addition, before patterning of the semiconductor layer 32, the silicon nitride film 57 formed on the semiconductor layer 32 is patterned, so that the silicon nitride film 57 remains on each of the emitter region 33 and the gate region 36.

At a step shown in FIG. 6B, a silicon oxide film is formed by CVD over the entire surface of the semiconductor base body 10 on the sides on which the emitter region 33 and the gate region 36 are formed, to a thickness of, for example, about 300 nm to 500 nm. The silicon oxide film is the same as the silicon oxide film 51 described with reference to FIG. 3G. Subsequently, the silicon oxide film is etched-back by RIE, to form emitter side walls 41 on side walls of both the emitter region 33 and the silicon nitride film 57 formed thereon, and to form gate side walls 42 on side walls of both the gate region 36 and the silicon nitride film 57 formed thereon.

Next, a polycrystalline silicon film 95 is formed over the entire surface of the semiconductor base body 10 on the sides on which the emitter region 33 and the gate region 36 are formed, to a thickness of, for example, about 100 nm to 200 nm.

The polycrystalline silicon film 95 is then entirely doped with boron ($B^+$) ions or boron difluoride ($BF_2^+$) ions by ion implantation. The ion implantation is performed at a dose of, for example, about $5 \times 10^{14}$ ions/$cm^2$ to $5 \times 10^{15}$ ions/$cm^2$ and an implantation energy of 10 keV to 30 keV. In the above ion implantation, since the emitter region 33 and the gate region 36 are masked with the silicon nitride film 57, they are not doped with boron ($B^+$) ions or boron difluoride ($BF_2^+$) ions.

As a result, regions which will be taken as graft base regions 34 and a base contact region 96 are formed in self-alignment in the first semiconductor layer 31 on both sides of the emitter region 33 via the emitter side walls 41, and at the same time regions which will be taken as source/drain regions 37, 38 and source/drain electrodes 97, 98 are formed in the first semiconductor layer 31 on both sides of the gate region 36 via the gate side walls 42.

Figure 6C:
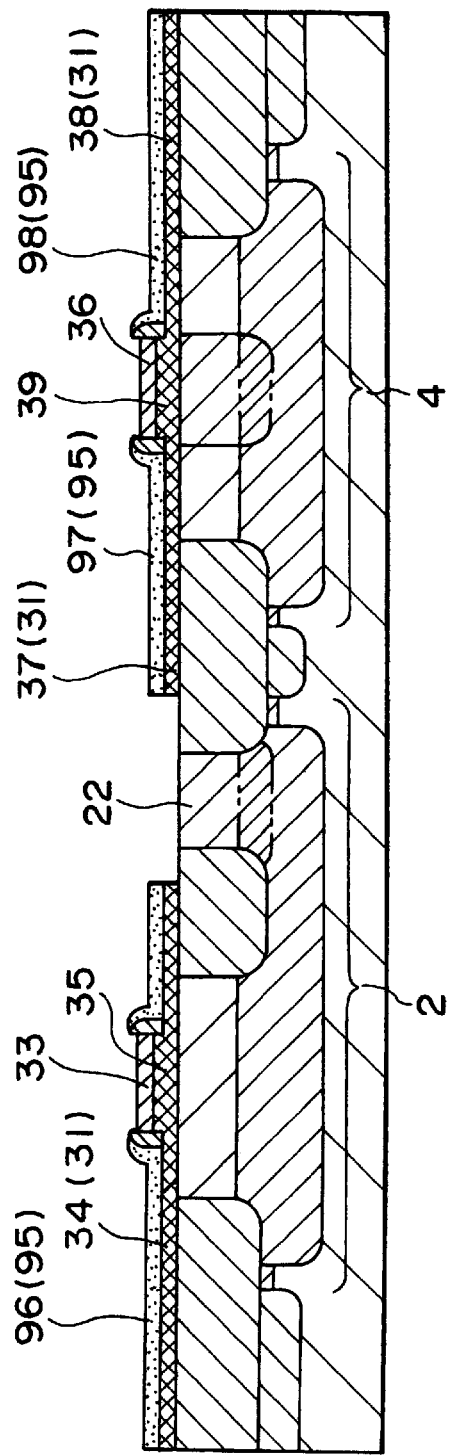

At a step shown in FIG. 6C, a resist mask (not shown) covering regions which will be taken as graft base regions and source/drain regions is formed by lithography, and the polycrystalline silicon film 95 and the first semiconductor layer 31 are etched using the resist mask, to isolate each of the polycrystalline silicon film 95 and the first semiconductor layer 31 into two parts on the first region 2 and the second region 4, and to remove a portion of the polycrystalline film 95 on the $N^+$-type collector contact region 22 and to remove portions of the polycrystalline silicon film 95 on the first semiconductor layer 31, emitter region 35, and gate region 36.

Namely, a base contact electrode 96 is formed of the polycrystalline silicon film 95 in the first region and graft base regions 34 are formed of the first semiconductor layer 31, with a portion of the semiconductor layer 31 between the graft base regions 34 taken as a base region 35. On the other hand, source/drain electrodes 97, 98 are formed of the polycrystalline silicon film 95 in the second region, and source/drain regions 37, 38 are formed of the first semiconductor layer 31, with a portion of the first semiconductor layer 31 between the source/drain regions 37, 38 taken as a channel region 39. The silicon nitride film 57 on the emitter region 33 and the gate region 36 is then removed by wet-etching using hot phosphoric acid.

Figure 6D:
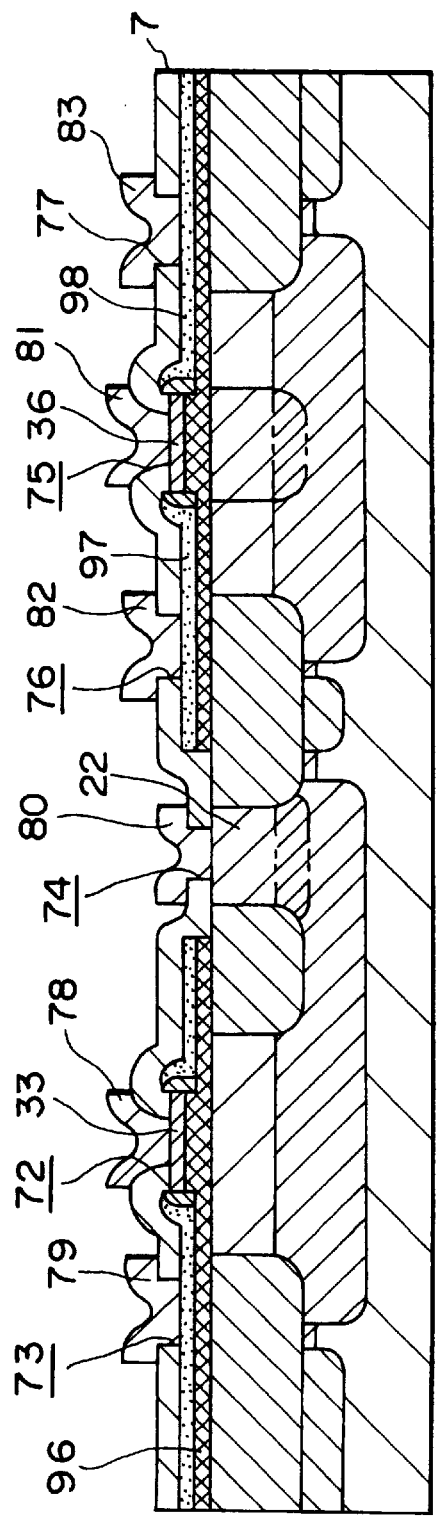
Figure 7A:
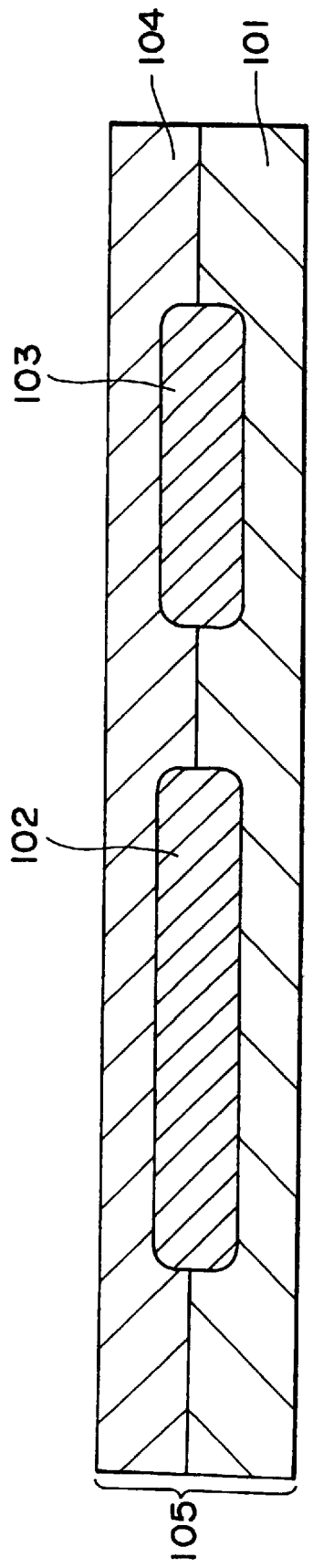
Figure 7B:
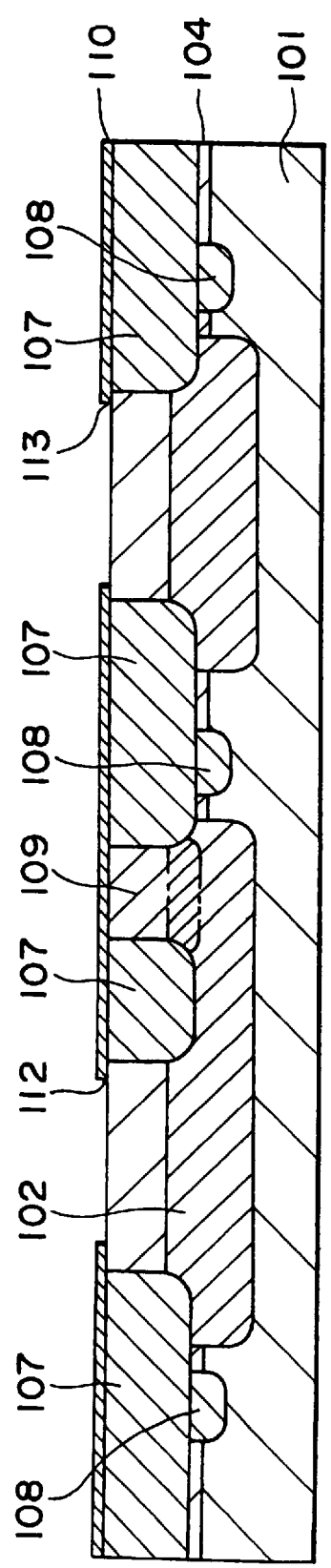
Figure 7C:
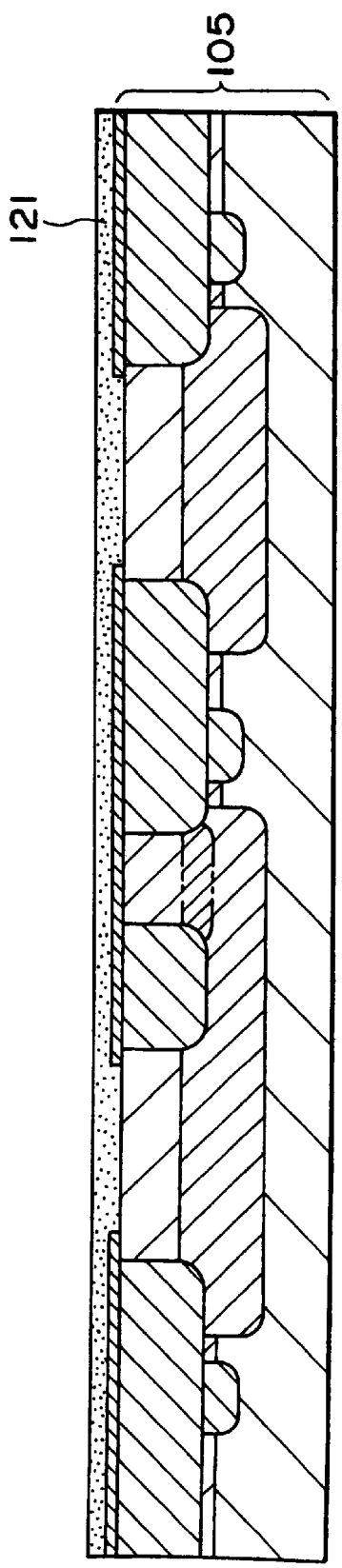
Figure 7D:
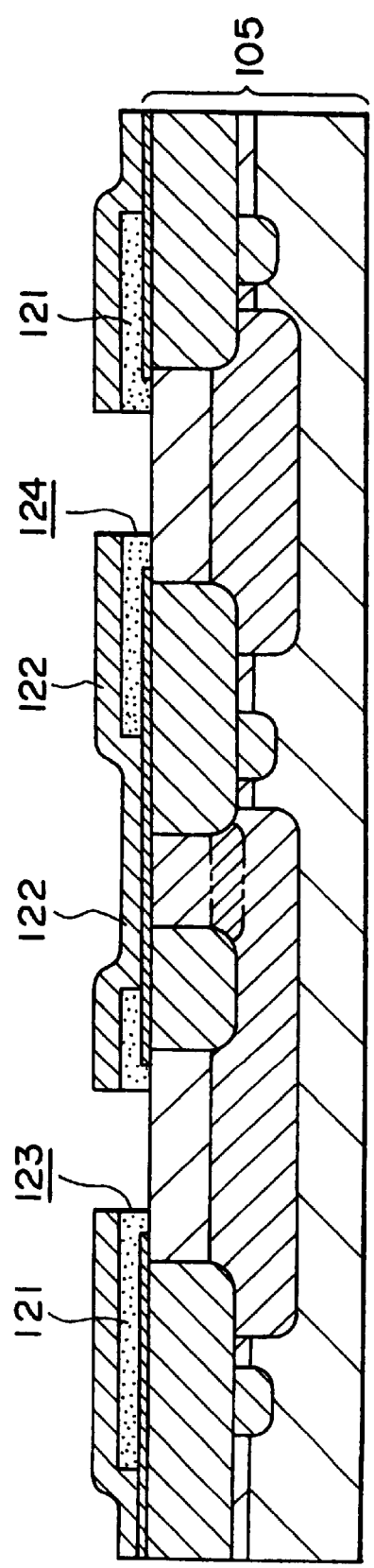
Figure 8:
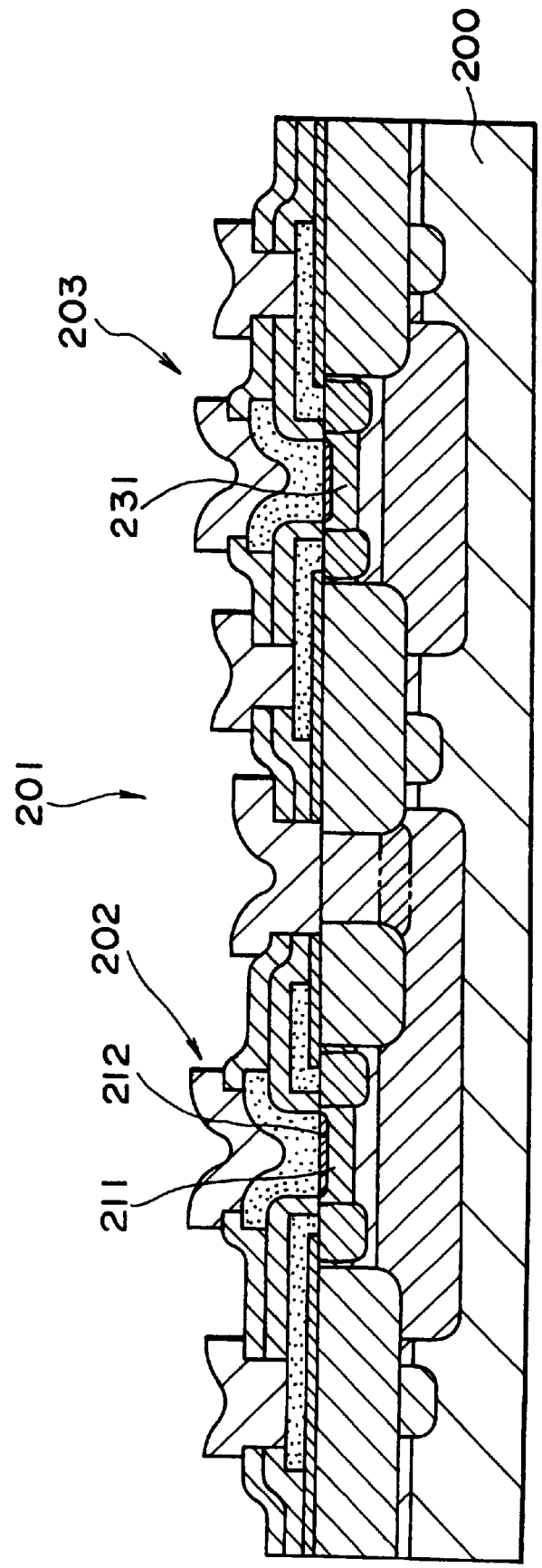
FIG. 8 is a view which illustrates another related art fabrication process.

After that, the steps of the first embodiment of the fabrication process shown in FIG. 3J to 3K will be repeated. Specifically, as shown in FIG. 6D, a silicon oxide film 71 is formed, followed by heat treatment at a temperature of about 900° C. to 1000° C., and is etched to have contact holes 72 to 74 respectively communicated to the emitter region 33, base contact region 96, and collector contact region 22, and to have contact holes 75 to 77 respectively communicated to the gate region 36 and source/drain electrodes 97, 98. Then, interconnections (or electrodes) 78 to 83 are formed in the contact-holes 72 to 77, respectively.

According to the fourth embodiment of the fabrication process of the present invention, since the base contact region 96 is formed of the polycrystalline silicon film 95 on one of the graft base regions 34 and the source/drain regions 97, 98 are respectively formed of the polycrystalline silicon film 95 on the source/drain regions 37, 38, it is possible to reduce an increase in resistances of the graft base regions 34 and the source/drain regions 37, 38 resulting from reduction in thickness of the first semiconductor layer 31 caused by over-etching of the second semiconductor layer 32 upon etching the second semiconductor layer 32 for forming the emitter region 33 and the gate region 36.

Further, the base contact region 96 and the source/drain regions 97, 98 can be formed only by the addition of the step of forming the polycrystalline silicon film 95. Also, a lithography step for forming an ion implantation mask for formation of the graft base regions 34 and source/drain regions 37, 38 is omitted, to thereby decrease the process load.

According to the semiconductor device of the above identified embodiments, since the channel region of the junction gate type field effect transistor is formed of the first semiconductor layer of the first conduction type which is comprised of a semiconductor material which is higher in carrier mobility than silicon, when the base region of the heterojunction bipolar transistor is formed of the same first conducting layer, the channel resistance becomes lower and the mutual conductance gm becomes higher. The result is that the junction gate type field effect transistor can exhibit a high amplitude ratio.

Further, in the junction gate type field effect transistor in which the heavily doped diffusion layer is formed in the lower gate region, the mutual conductance gm becomes higher, with a result that a higher amplitude ratio can be obtained.

According to the process of fabricating a semiconductor device of the present invention, the channel region and the source/drain regions of the junction gate type field effect transistor are formed of the first semiconductor layer which forms the base region and the graft base regions of the heterojunction bipolar transistor. The gate region of the junction gate type field effect transistor is formed of the second semiconductor layer which forms the emitter region of the heterojunction bipolar transistor. Accordingly, the junction gate type field effect can be formed using the existing process technique for the heterojunction bipolar transistor without the addition of any new step.

The present invention is subject to many variations, modifications and changes in detail. It is intended that all matter described throughout the specification and shown in the accompanying drawings be considered illustrative only. Accordingly, it is intended that the invention be limited only by the spirit and scope of the appended claims.

We claim as our invention:

1. A semiconductor device comprising:

a heterojunction bipolar transistor in a first region of a semiconductor base;

a junction gate type field effect transistor in a second region of said semiconductor base, said second region being electrically separated from said first region;

wherein a base of said heterojunction bipolar transistor, graft base regions connected to said base, a channel region of said junction gate type field effect transistor, and source/drain regions connected to said channel region, are formed from a first semiconductor layer of a first conduction type, said first semiconductor layer comprised of semiconductor material which is higher in carrier mobility than silicon; and an emitter region of said heterojunction bipolar transistor and a gate region of said junction gate type field effect transistor are formed from a second semiconductor layer of a second conduction type, said second semiconductor layer forming a heterojunction with said first semiconductor layer of said first conduction type, wherein a heavily doped diffusion layer is formed in a lower gate region of said semiconductor base at a portion under said channel region of said junction gate type field effect transistor, said heavily doped diffusion layer having a higher impurity concentration than said lower gate region and having a same conduction type as said lower gate region.

2. A semiconductor device according to claim 1, wherein said semiconductor material which is higher in carrier mobility than silicon, contains germanium.

3. A semiconductor device comprising:

a heterojunction bipolar transistor in a first region of a semiconductor base;

a junction gate type field effect transistor in a second region of said semiconductor base, said second region being electrically separated from said first region; and wherein a base region of said heterojunction bipolar transistor and a channel region of said junction gate type field effect transistor are formed of a first semiconductor layer of a first conduction type, said first semiconductor layer comprised of semiconductor material which is higher in carrier mobility than silicon, wherein said semiconductor material which is higher in carrier mobility than silicon, comprises germanium.

4. A semiconductor device comprising:

A heterojunction bipolar transistor at a first region of a semiconductor substrate;

a junction gate type field effect transistor at a second region of said semiconductor substrate, said second region being electrically separated from said first region;

wherein a base region of said heterojunction bipolar transistor, graft base regions connected to said base region, a channel region of said junction gate type field effect transistor, and source/drain regions connected to said channel region, are formed of a first semiconductor layer of a first conduction type, said first semiconductor layer comprised of semiconductor material which is higher in carrier mobility than silicon; and an emitter region of said heterojunction bipolar transistor and a gate region of said junction gate type field effect transistor are formed of a second semiconductor layer of a second conduction type, said second semiconductor layer forming a heterojunction with said first semiconductor layer of said first conduction type, wherein a heavily doped diffusion layer is formed at a lower gate region of said semiconductor substrate at a portion under said channel region of said junction gate type field effect transistor, said heavily doped diffusion layer having a higher impurity concentration than said lower gate region and having a same conduction type as said lower gate region.

5. A semiconductor device according to claim 4, wherein said semiconductor material which is higher in carrier mobility than silicon, comprises germanium.

* * * * *